(12) United States Patent
Behzad et al.

(10) Patent No.: US 8,866,502 B2
(45) Date of Patent: Oct. 21, 2014

(54) SIMULTANEOUSLY TAGGING OF SEMICONDUCTOR COMPONENTS ON A WAFER

(75) Inventors: Arya Reza Behzad, Poway, CA (US); Ahmadreza Rofougaran, Newport Coast, CA (US); Sam Ziqun Zhao, Irvine, CA (US); Jesus Alfonso Castaneda, Los Angeles, CA (US); Michael Boers, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 552 days.

(21) Appl. No.: 13/029,653

(22) Filed: Feb. 17, 2011

(65) Prior Publication Data
US 2011/0309852 A1    Dec. 22, 2011

Related U.S. Application Data

(60) Provisional application No. 61/355,226, filed on Jun. 16, 2010, provisional application No. 61/429,277, filed on Jan. 3, 2011.

(51) Int. Cl.
| | | |
|---|---|---|
| *G01R 31/36* | (2006.01) | |
| *G01R 31/319* | (2006.01) | |
| *G01R 31/302* | (2006.01) | |
| *G01R 31/311* | (2006.01) | |
| *G01R 31/28* | (2006.01) | |

(52) U.S. Cl.
CPC .......... *G01R 31/319* (2013.01); *G01R 31/2834* (2013.01); *G01R 31/3025* (2013.01); *G01R 31/311* (2013.01)
USPC ........ 324/750.15; 343/795; 29/827; 714/723; 375/226

(58) Field of Classification Search
USPC ............... 324/750, 750.15; 343/795; 29/827; 714/723; 375/226
See application file for complete search history.

(56) References Cited

U.S. PATENT DOCUMENTS

| | | | |
|---|---|---|---|
| 4,985,988 A | * | 1/1991 | Littlebury ...................... 438/15 |
| 5,548,637 A | | 8/1996 | Heller et al. |

(Continued)

FOREIGN PATENT DOCUMENTS

| | | |
|---|---|---|
| CN | 101256215 A | 9/2008 |
| CN | 101390327 A | 3/2009 |

(Continued)

OTHER PUBLICATIONS

European Search Report for EP Patent Application No. EP 11004345, European Office, Munich, Germany, mailed on Jul. 9, 2012.

(Continued)

*Primary Examiner* — Patrick Assouad
*Assistant Examiner* — Sean Curtis
(74) *Attorney, Agent, or Firm* — Sterne, Kessler, Goldstein & Fox P.L.L.C.

(57) ABSTRACT

Methods and apparatus are disclosed to simultaneously, wirelessly test semiconductor components formed on a semiconductor wafer. The semiconductor components transmit respective outcomes of a self-contained testing operation to wireless automatic test equipment via a common communication channel. Multiple receiving antennas observe the outcomes from multiple directions in three dimensional space. The wireless automatic test equipment determines whether one or more of the semiconductor components operate as expected and, optionally, may use properties of the three dimensional space to determine a location of one or more of the semiconductor components. The wireless testing equipment may additionally determine performance of the semiconductor components by detecting infrared energy emitted, transmitted, and/or reflected by the semiconductor wafer before, during, and/or after a self-contained testing operation.

22 Claims, 19 Drawing Sheets

(56) References Cited

U.S. PATENT DOCUMENTS

| | | | |
|---|---|---|---|
| 6,127,837 A | 10/2000 | Yamamoto et al. | |
| 6,339,337 B1 | 1/2002 | Matsuda et al. | |
| 6,617,172 B2* | 9/2003 | Usami | 438/2 |
| 7,412,639 B2 | 8/2008 | Volkerink et al. | |
| 7,733,077 B1* | 6/2010 | Merewether et al. | 324/67 |
| 7,859,276 B1 | 12/2010 | Stevens et al. | |
| 7,880,613 B1 | 2/2011 | Maeng | |
| 7,915,908 B2 | 3/2011 | Pagani | |
| 8,370,428 B1 | 2/2013 | Bayliss et al. | |
| 2002/0011852 A1 | 1/2002 | Mandelis et al. | |
| 2002/0173336 A1 | 11/2002 | Ranta et al. | |
| 2002/0195721 A1 | 12/2002 | Lee et al. | |
| 2002/0197955 A1 | 12/2002 | Witkowski et al. | |
| 2004/0075453 A1* | 4/2004 | Slupsky | 324/750 |
| 2005/0121765 A1 | 6/2005 | Lin | |
| 2005/0193294 A1* | 9/2005 | Hildebrant | 714/723 |
| 2006/0176851 A1 | 8/2006 | Bennett et al. | |
| 2006/0191622 A1 | 8/2006 | Ritter et al. | |
| 2006/0252375 A1 | 11/2006 | Wu et al. | |
| 2007/0200236 A1 | 8/2007 | Ishiyama | |
| 2007/0203672 A1 | 8/2007 | Desai et al. | |
| 2007/0290696 A1 | 12/2007 | Majima et al. | |
| 2008/0048883 A1 | 2/2008 | Boaz | |
| 2008/0084942 A1 | 4/2008 | Hosseinian | |
| 2008/0114768 A1* | 5/2008 | Sadovsky et al. | 707/9 |
| 2008/0150823 A1* | 6/2008 | Mohammadian et al. | 343/795 |
| 2008/0170610 A1* | 7/2008 | Harper | 375/226 |
| 2008/0204055 A1 | 8/2008 | Pagani | |
| 2009/0153158 A1 | 6/2009 | Dunn et al. | |
| 2009/0216473 A1 | 8/2009 | Hart et al. | |
| 2009/0304045 A1 | 12/2009 | Lei et al. | |
| 2010/0289679 A1 | 11/2010 | Dasnurkar | |
| 2011/0309842 A1 | 12/2011 | Behzad et al. | |
| 2011/0309851 A1 | 12/2011 | Behzad et al. | |
| 2011/0313710 A1 | 12/2011 | Behzad et al. | |
| 2011/0313711 A1 | 12/2011 | Behzad et al. | |
| 2013/0311127 A1 | 11/2013 | Behzad et al. | |

FOREIGN PATENT DOCUMENTS

| | | |
|---|---|---|
| TW | 1264551 | 10/2006 |
| TW | 200946934 A | 11/2009 |
| WO | WO 2010/031879 A1 | 3/2010 |

OTHER PUBLICATIONS

Wu, C. et al., "The HOY Tester—Can IC Testing Go Wireless?" *Automation and Test 2006*, 4 pages (Apr. 26, 2006).

Communication from the Examining Division of the European Patent Office for EP Patent Application No. EP 11004345, mailed Apr. 11, 2013; 11 pages.

Communication from the Examining Division of the European Patent Office for EP Patent Application No. EP 11004345, mailed Nov. 2, 2013; 7 pages.

Office Action for related Chinese Patent Application No. 2011101625389, mailed May 17, 2013; 6 pages.

Office Action for related Taiwanese Patent Application No. 100121004, mailed May 22, 2014; 6 pages.

English-language abstract of Taiwanese Patent Application Publication No. 200946934; 1 page.

\* cited by examiner

SIMULTANEOUSLY TAGGING OF SEMICONDUCTOR COMPONENTS ON A WAFER

CROSS-REFERENCE TO RELATED APPLICATIONS

The present application claims the benefit of U.S. Provisional Patent Appl. Nos. 61/355,226, filed Jun. 16, 2010, and 61/429,277, filed on Jan. 3, 2011, each of which is incorporated herein by reference in its entirety.

BACKGROUND

1. Field of Invention

The present invention relates generally to testing of semiconductor components within a semiconductor wafer and specifically to wireless testing of the semiconductor components within the semiconductor wafer simultaneously and, optionally, measuring a performance of the semiconductor components within the semiconductor wafer.

2. Related Art

A semiconductor device fabrication operation is commonly used to manufacture components onto a semiconductor substrate to form a semiconductor wafer. The semiconductor device fabrication operation uses a predetermined sequence of photographic and/or chemical processing steps to form components onto the semiconductor substrate. However, imperfections within the semiconductor wafer, such as imperfections of the semiconductor substrate, imperfections of the semiconductor device fabrication operation, or imperfections in design of the components themselves, may cause one or more of the semiconductor components to operate differently than expected.

Conventional automatic test equipment (ATE) is commonly used to verify that the semiconductor components within the semiconductor wafer operate as expected. The conventional automatic test equipment includes a full complement of electronic testing probes to carry out a testing operation. This full complement of electronic testing probes includes electronic testing probes to apply power, digital testing signals, and/or analog testing signals to each of the semiconductor components to perform the testing operation. This full complement of electronic testing probes also includes electronic probes to read signals at various nodes of the semiconductor components to verify that each of the semiconductor components operates as expected during the testing operation.

Improvements in semiconductor device fabrication techniques have allowed the manufacture of more complex semiconductor components, in greater quantities, onto the semiconductor substrate requiring more electronic probes to perform the testing operation. Typically, the electronic probes are in direct contact with specially designated locations, commonly referred to as testing points, within the semiconductor components. These more complex semiconductor components require more testing points to perform the testing operation which occupy more real estate on the semiconductor substrate that could be allocated elsewhere. As a result, these improvements in semiconductor device fabrication have led to an increase of the overall size and cost of the conventional automatic test equipment.

Thus, there is a need for automatic test equipment that verify the semiconductor components within the semiconductor wafer operate as expected that overcomes the shortcomings described above. Further aspects and advantages of the present invention will become apparent from the detailed description that follows.

BRIEF DESCRIPTION OF THE DRAWINGS/FIGURES

Embodiments of the invention are described with reference to the accompanying drawings. In the drawings, like reference numbers indicate identical or functionally similar elements. Additionally, the left most digit(s) of a reference number identifies the drawing in which the reference number first appears.

Figure 7:
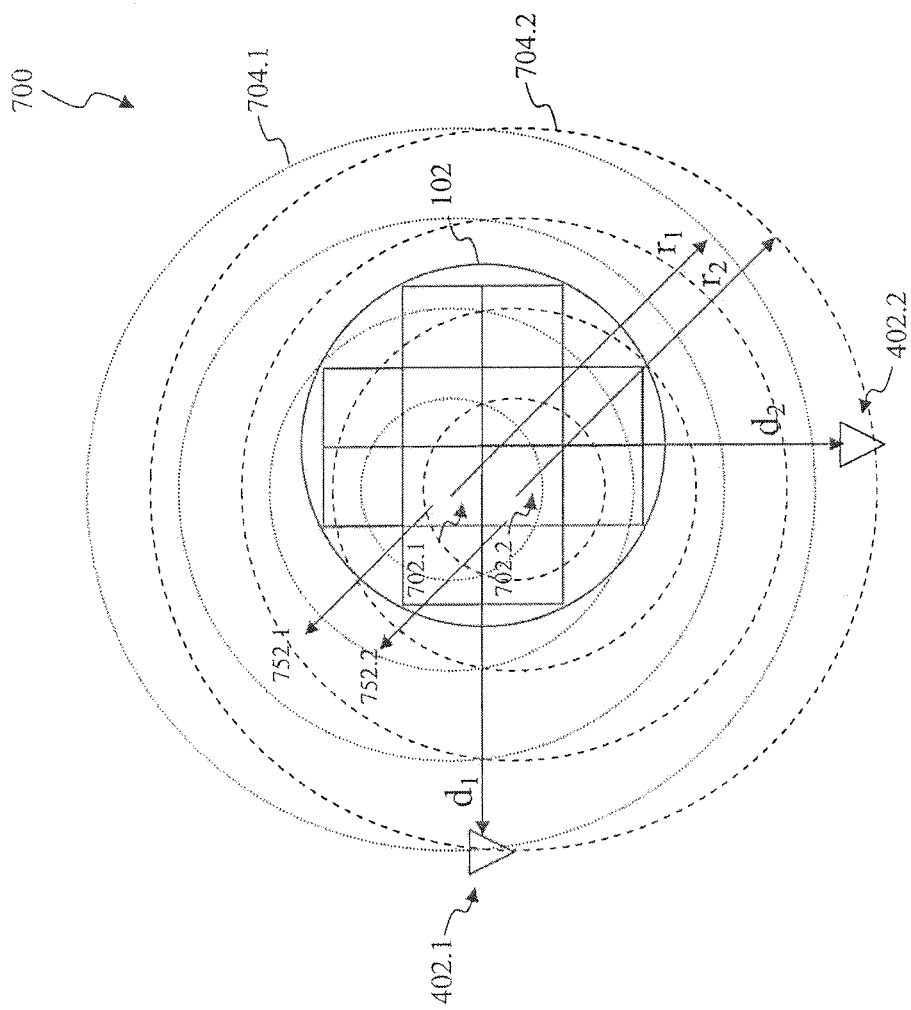

FIG. 7 graphically illustrates a first transmission field pattern of more than one of the semiconductor components according to an exemplary embodiment of the present invention.

Figure 8:
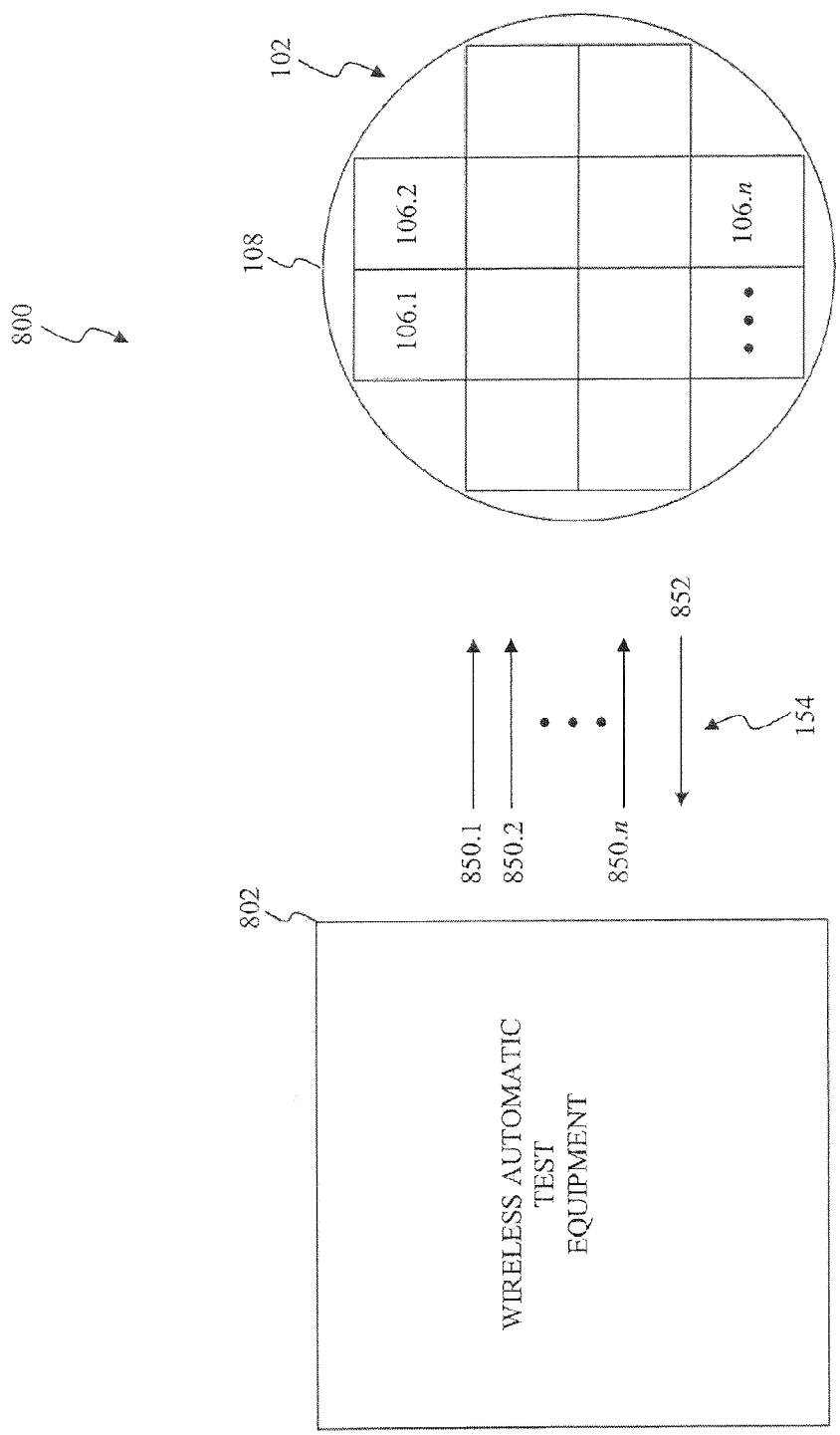

FIG. 8 illustrates a schematic block diagram of a second wireless component testing environment according to a second exemplary embodiment of the present invention.

Figure 9:
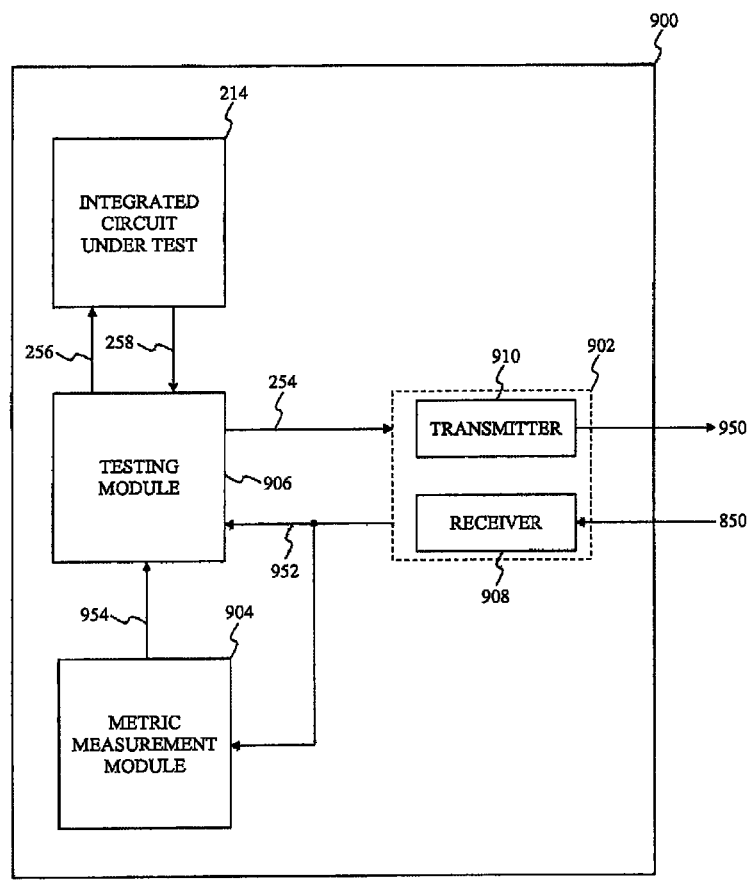

FIG. 9 illustrates a schematic block diagram of a second semiconductor component according to a first exemplary embodiment of the present invention.

Figure 10:
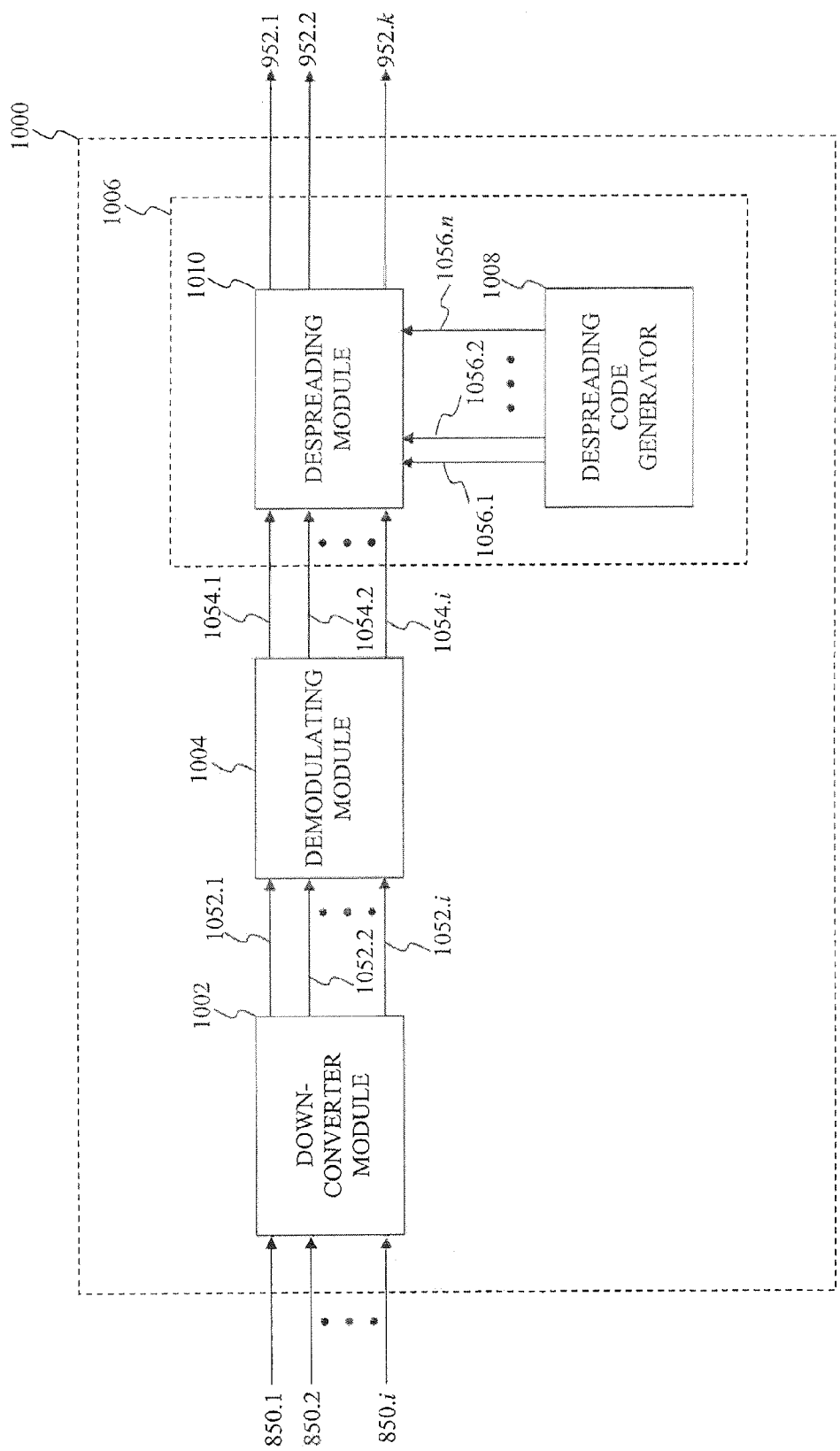

FIG. 10 illustrates a schematic block diagram of a receiver module implemented as part of the second exemplary semiconductor component according to an exemplary embodiment of the present invention.

Figure 11:
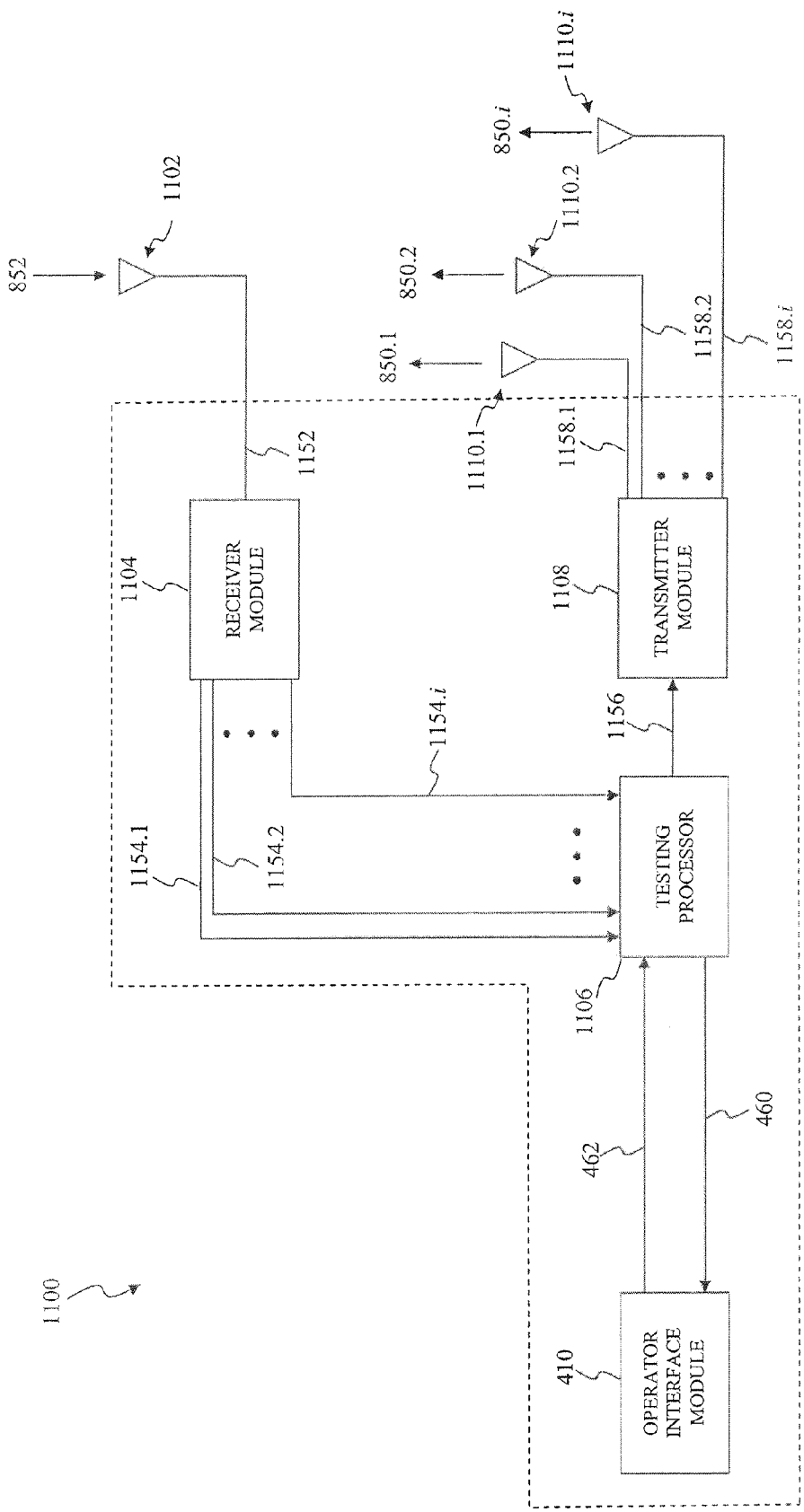

FIG. 11 illustrates a schematic block diagram of a second wireless automatic test equipment according to a first exemplary embodiment of the present invention.

Figure 12:
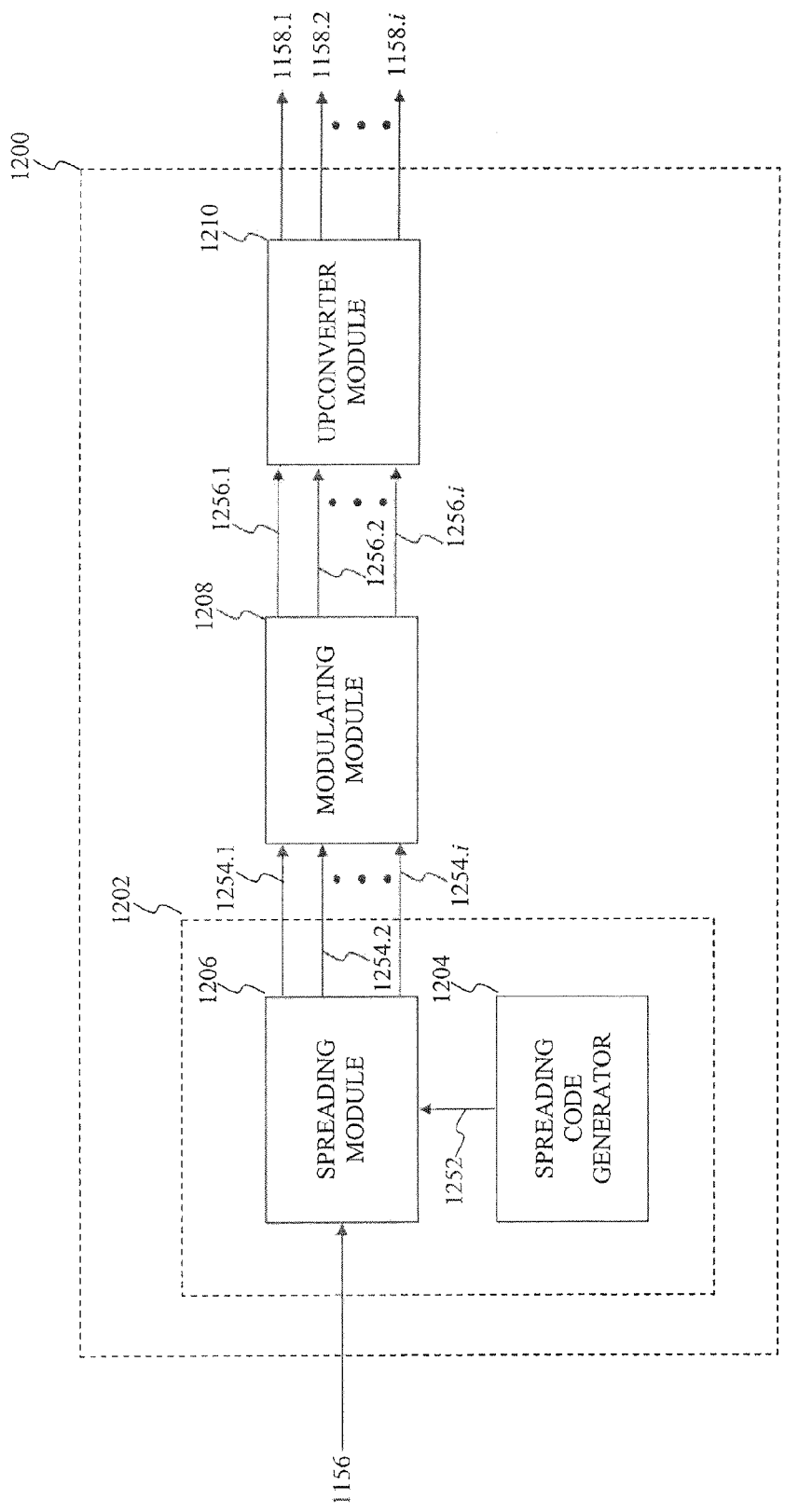

FIG. 12 illustrates a schematic block diagram of a first transmitter module implemented as part of the second wireless automatic test equipment according to a first exemplary embodiment of the present invention.

Figure 13:
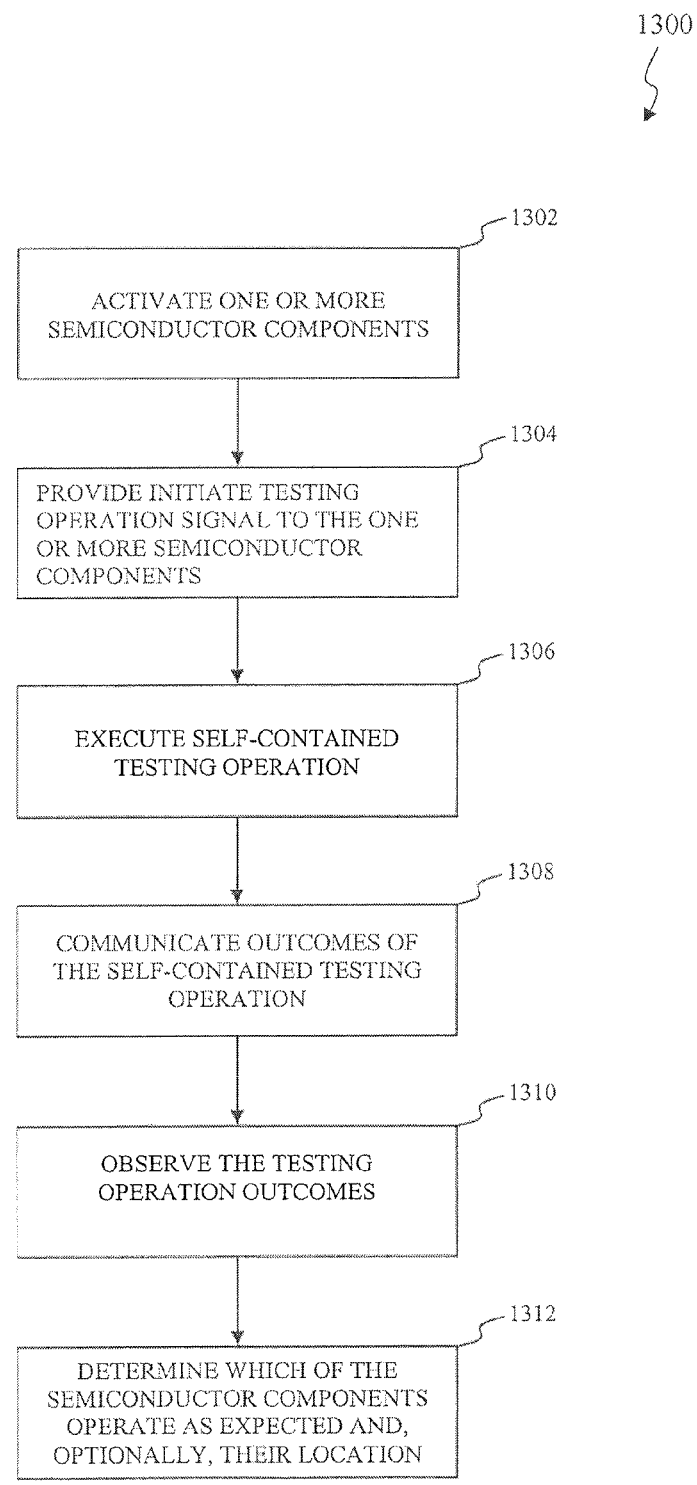

FIG. 13 is a flowchart of exemplary operational steps of a wireless automatic test equipment according to an exemplary embodiment of the present invention.

Figure 14:
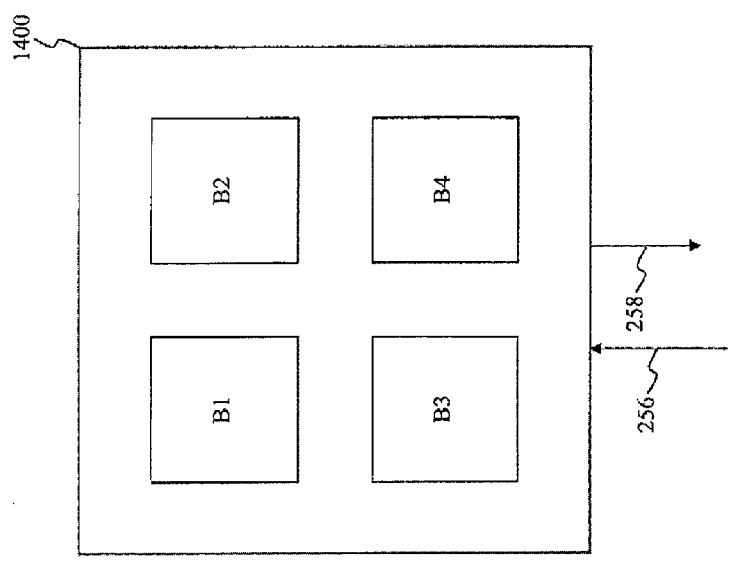

FIG. 14 illustrates a schematic block diagram of an integrated circuit under test implemented as part of the first and/or the second exemplary semiconductor components according to an exemplary embodiment of the present invention.

Figure 15:
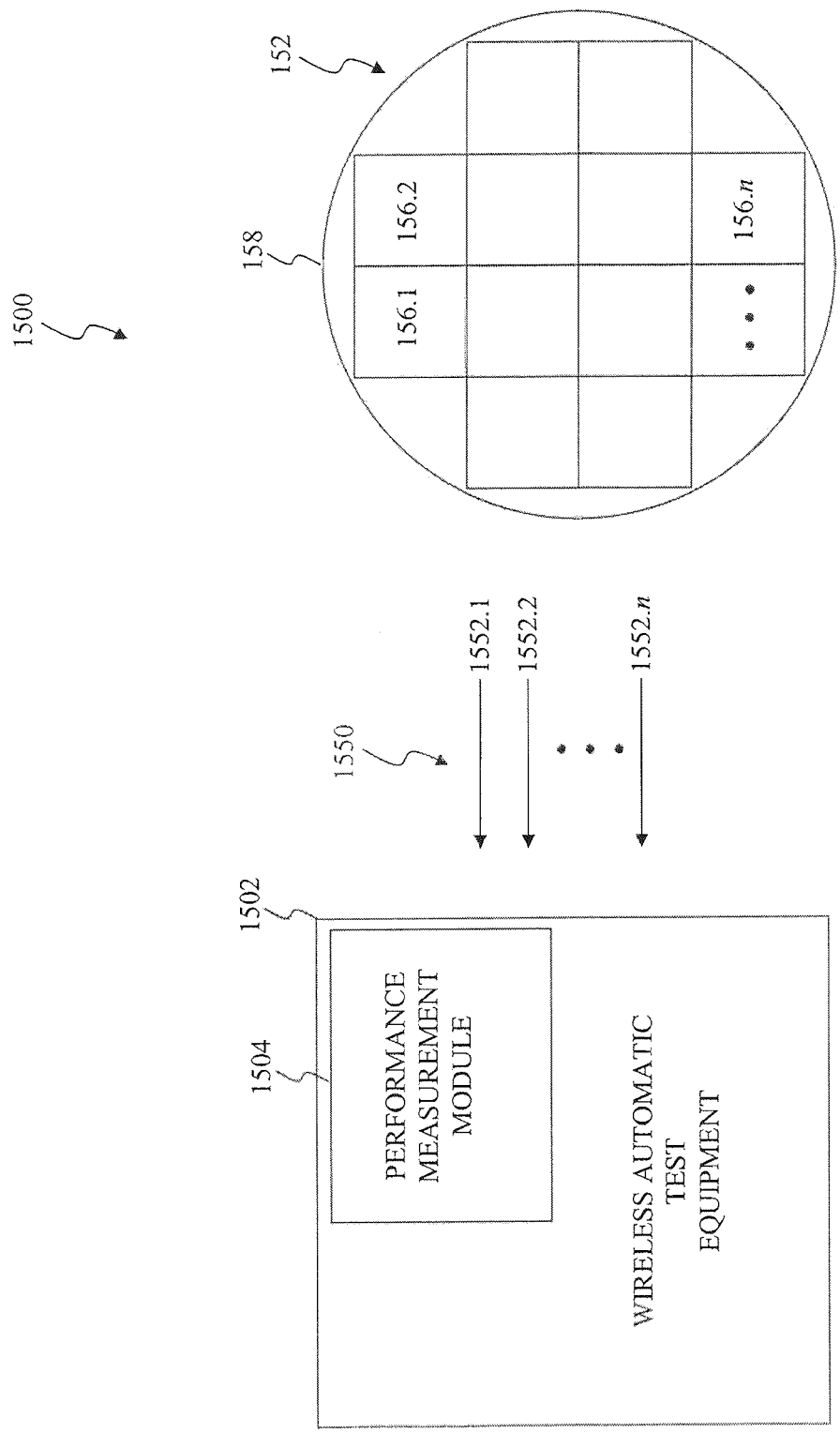

FIG. 15 illustrates a schematic block diagram of a thermal imaging module that may be implemented as part of the first or the second exemplary wireless automatic test equipment according to an exemplary embodiment of the present invention.

Figure 16:
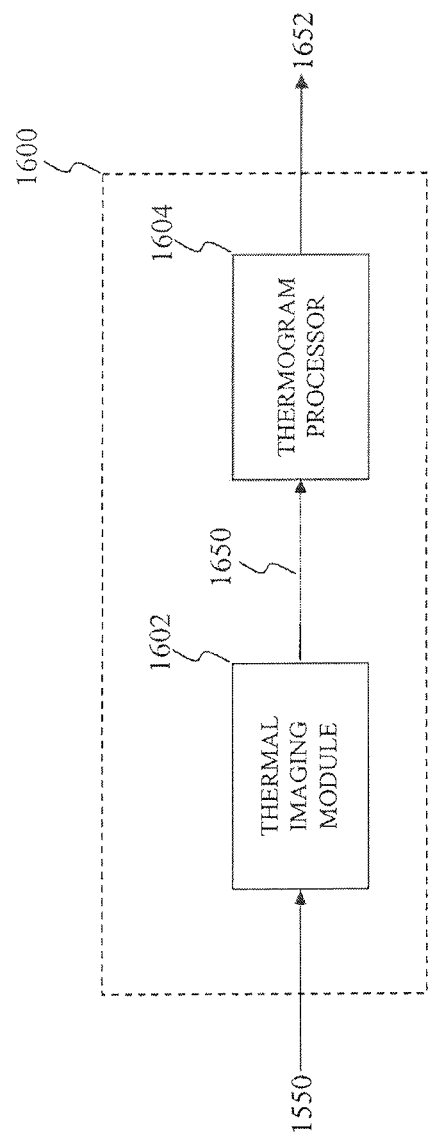

FIG. 16 illustrates a schematic block diagram of an optional performance measurement module implemented as part of the first or the second exemplary wireless automatic test equipment according to an exemplary embodiment of the present invention.

Figure 17:
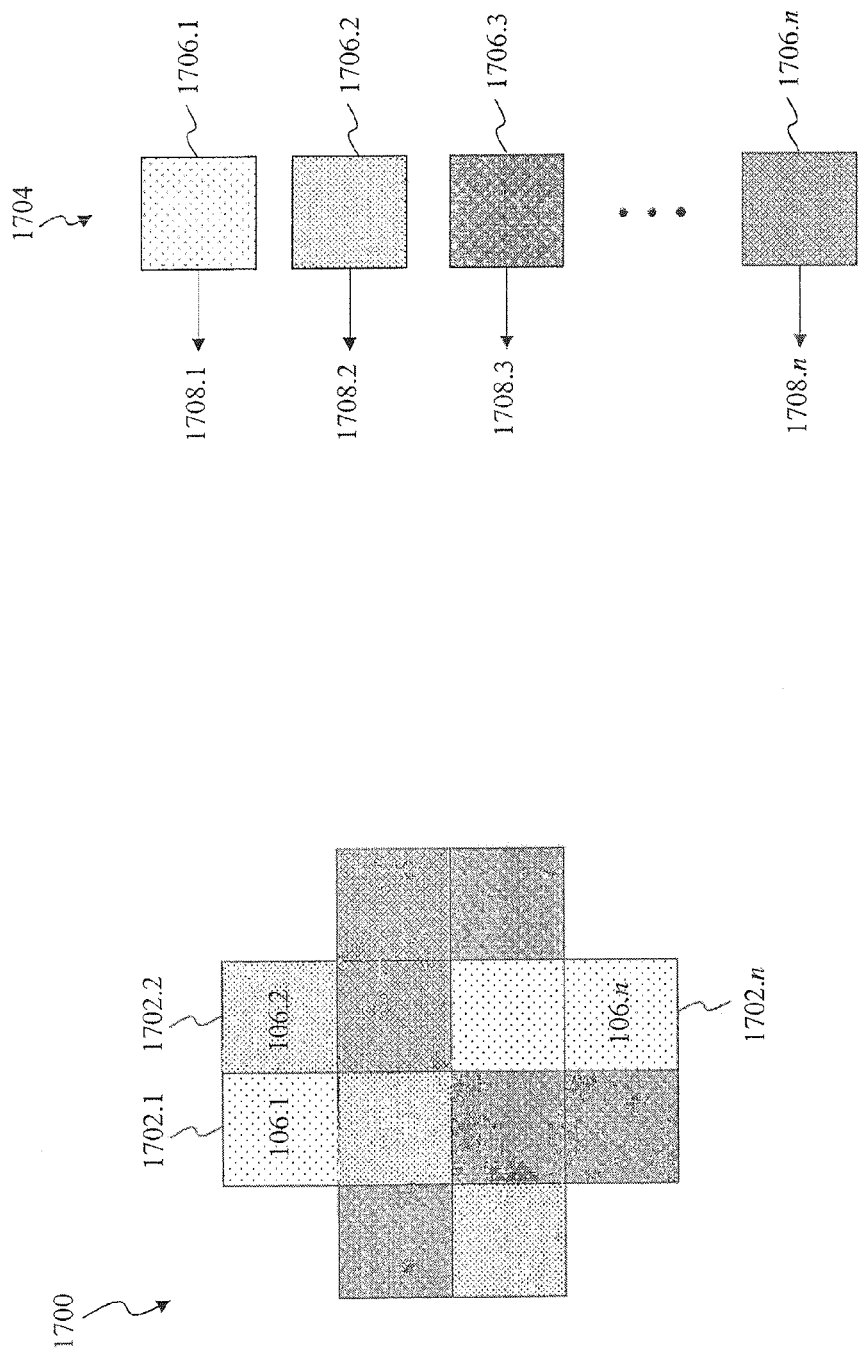

FIG. 17A illustrates an operation of a thermogram processor used in the second wireless automatic test equipment according to an exemplary embodiment of the present invention.

FIG. 17B illustrates predetermined semiconductor component thermograms according to an exemplary embodiment of the present invention.

Figure 18:
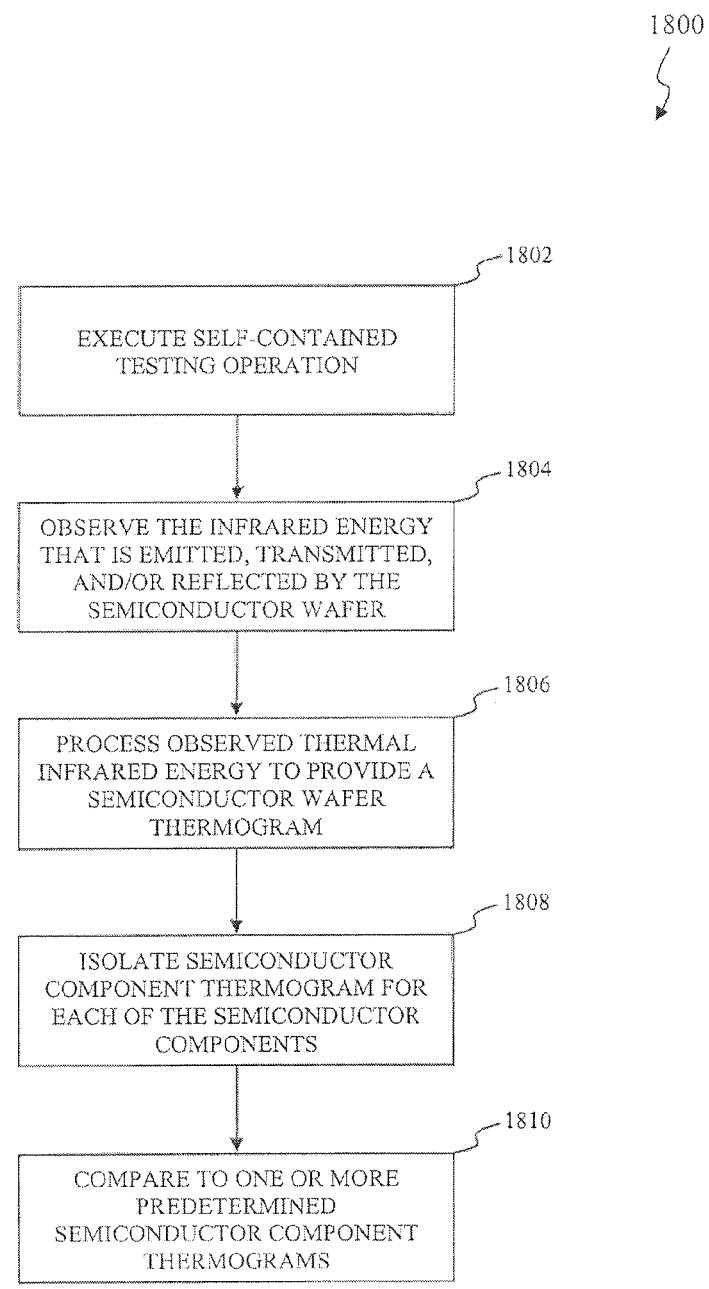

FIG. 18 is a flowchart of exemplary operational steps of the second wireless component testing environment according to an exemplary embodiment of the present invention.

Embodiments of the invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

First Exemplary Wireless Component Testing Environment

Figure 1:
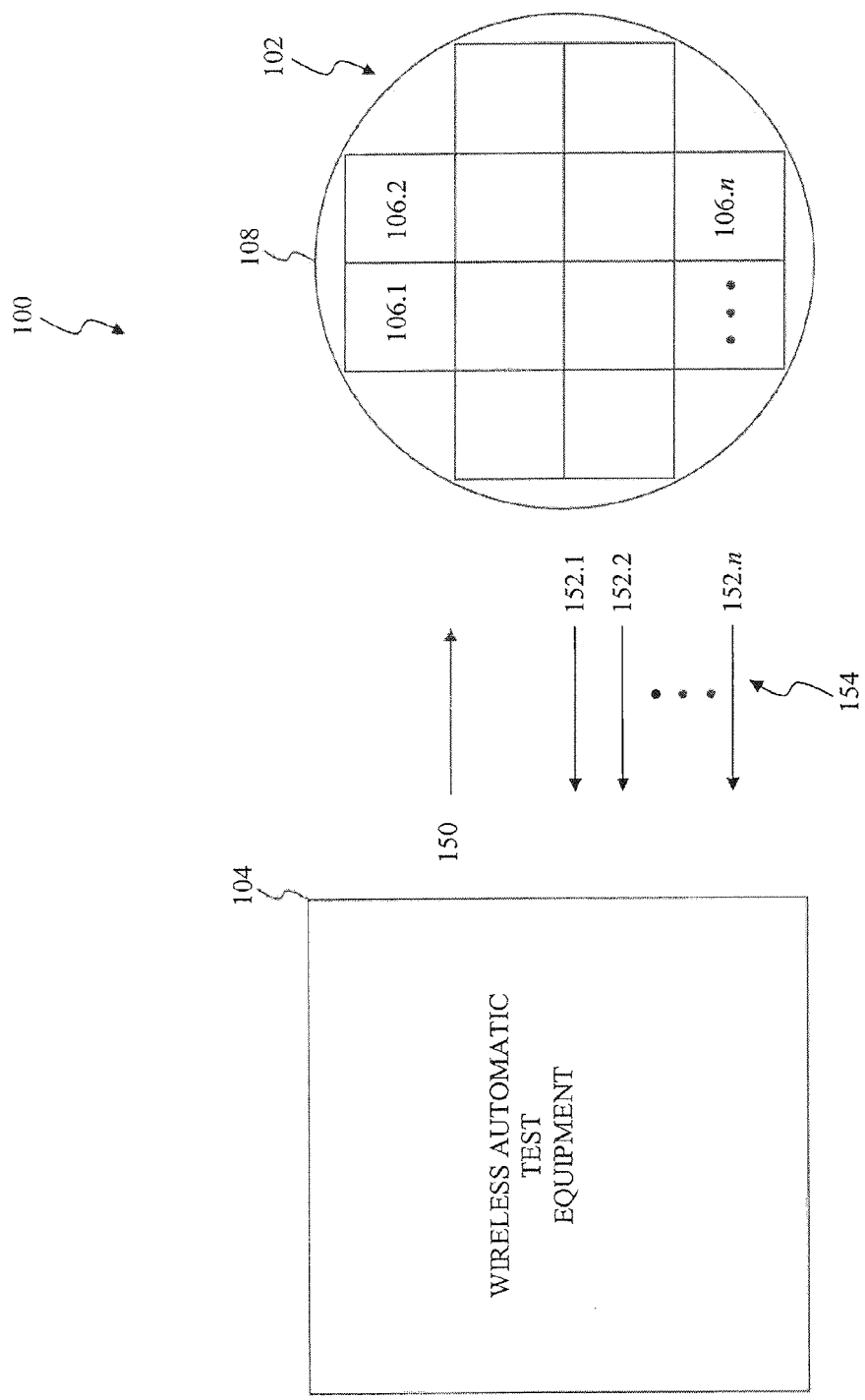
FIG. 1 illustrates a first schematic block diagram of a wireless component testing environment according to a first exemplary embodiment of the present invention.

FIG. 1 illustrates a first schematic block diagram of a wireless component testing environment according to a first exemplary embodiment of the present invention. A semiconductor device fabrication operation is commonly used to manufacture components onto a semiconductor substrate to form a semiconductor wafer. The semiconductor device fabrication operation uses a predetermined sequence of photographic and/or chemical processing steps to form the components onto the semiconductor substrate. However, imperfections within the semiconductor wafer, such as imperfections of the semiconductor substrate, imperfections of the semiconductor device fabrication operation, or imperfections in design of the components themselves to provide some examples, may cause one or more of the components to operate differently than expected.

A wireless testing environment 100 allows for simultaneous testing of semiconductor components 106.1 through 106.$n$, herein referred to as the semiconductor components 106 by wireless automatic test equipment 104. The semiconductor components 106 represent any combination of electrical components, such as any combination of active components, passive components, or other suitable components that will be apparent to those skilled in the relevant art(s) to provide some examples, that are configured and arranged to form one or more integrated circuits. The semiconductor components 106 may be similar and/or dissimilar to each other. The semiconductor substrate 108 represents a base that the semiconductor device fabrication operation forms the semiconductor components 106 onto. The semiconductor substrate 108 is typically a thin slice of semiconductor material, such as a silicon crystal, but may include other materials, or combinations of materials, such as sapphire or any other suitable material that will be apparent to those skilled in the relevant art(s) without departing from the spirit and scope of the present invention. The semiconductor wafer 102 represents the semiconductor substrate 108 having the semiconductor components 106 formed onto by the semiconductor device fabrication operation.

The wireless automatic test equipment 104 wirelessly tests one or more of the semiconductor components 106 simultaneously to verify that these one or more of the semiconductor components 106 operate as expected. The wireless automatic test equipment 104 provides an initiate testing operation signal 150 to the semiconductor components 106. The initiate testing operation signal 150 represents a radio communication signal that is wirelessly transmitted to the semiconductor components 106.

The initiate testing operation signal 150 is simultaneously observed by one or more of the semiconductor components 106. The semiconductor components 106 that received the initiate testing operation signal 150 enter into a testing mode of operation, whereby these semiconductor components 106 execute a self-contained testing operation. The self-contained testing operation may utilize a first set of parameters provided by the initiate testing operation signal 150 to be used by a first set of instructions that are stored within the semiconductor components 106. Alternatively, the self-contained testing operation may execute a second set of instructions provided by the initiate testing operation signal 150 and/or a second set of parameters to be used by the second set of instructions that are provided by the initiate testing operation signal 150. In another alternate, the self-contained testing operation may include any combination of the first set of instructions, the second set of instructions, the first set of parameters and/or the second set of parameters. The wireless automatic test equipment 104 may provide the initiate testing operation signal 150 during the self-contained testing operation to provide additional parameters and/or instructions to the semiconductor components 106.

After completion of the self-contained testing operation, the semiconductor components 106 wirelessly transmit testing operation outcomes 152.1 through 152.n, herein testing operation outcomes 152, to the wireless automatic test equipment 104 via a common communication channel 154. The common communication channel 154 represents a communication channel that is be simultaneously utilized or shared by the semiconductor components 106. Collectively, the semiconductor components 106 communicate the testing operation outcomes 152 over the common communication channel 154 using a multiple access transmission scheme. The multiple access transmission scheme may include any single carrier multiple access transmission scheme such as code division multiple access (CDMA), frequency division multiple access (FDMA), time division multiple access (TDMA), and/or any other suitable single carrier multiple access scheme that will be apparent by those skilled in the relevant art(s) without departing from the spirit and scope of the present invention. Alternatively, the multiple access transmission scheme may include any multiple carrier multiple access transmission scheme such as discrete multi-tone (DMT) modulation, orthogonal frequency division multiplexing (OFDM), coded OFDM (COFDM), and/or any other suitable multiple carrier multiple access scheme that will be apparent by those skilled in the relevant art(s) without departing from the spirit and scope of the present invention. In another alternate, the multiple access transmission scheme may include any combination of the single carrier multiple access transmission scheme and the multiple carrier multiple access transmission scheme.

The wireless automatic test equipment 104 observes the testing operation outcomes 152 as they pass through the common communication channel 154 using one or more receiving antennas positioned in three-dimensional space. The wireless automatic test equipment 104 determines one or more signal metrics, such as a mean, a total energy, an average power, a mean square, an instantaneous power, a root mean square, a variance, a norm, a voltage level and/or any other suitable signal metric that will be apparent by those skilled in the relevant art(s) provide some examples, of the testing operation outcomes 152 as observed by the one or more receiving antennas. The wireless automatic test equipment 104 uses the one or more signal metrics to map the testing operation outcomes 152 to the semiconductor components 106. The wireless automatic test equipment 104 determines a first group of semiconductor components from among the semiconductor components 106 that operate as expected, and optionally their location within the semiconductor wafer 102, based upon the testing operation outcomes 152 as observed by the one or more receiving antennas. Alternatively, the wireless automatic test equipment 104 may determine a second group of semiconductor components from among the semiconductor components 106 that operate unexpectedly based upon the testing operation outcomes 152 as observed by the one or more multiple receiving antennas. The wireless automatic test equipment 104 may, optionally, provide a location of the second group of semiconductor components within the semiconductor wafer 102. In another alternate, the wireless automatic test equipment 104 may deter nine any combination of the first group of semiconductor components and the second group of semiconductor components and, optionally, provide their corresponding locations within the semiconductor wafer 102.

First Exemplary Semiconductor Component

Figure 2:
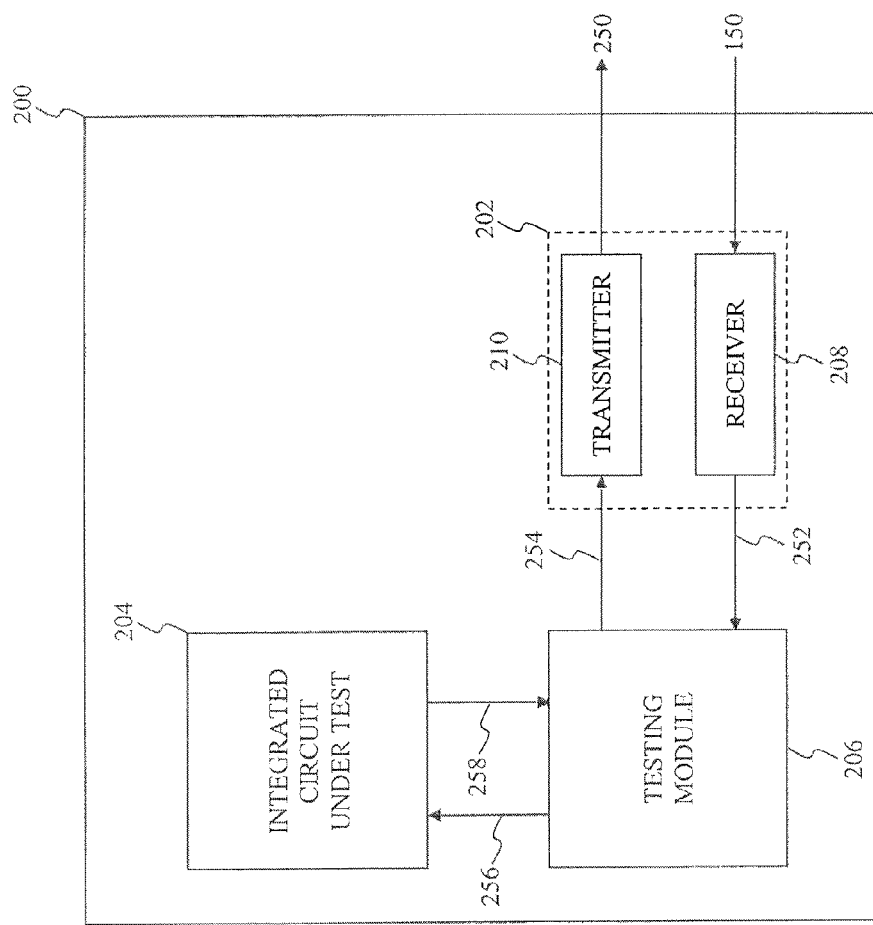
FIG. 2 illustrates a first schematic block diagram of a semiconductor component according to a first exemplary embodiment of the present invention.

FIG. 2 illustrates a first schematic block diagram of a semiconductor component according to a first exemplary embodiment of the present invention. A semiconductor component 200 observes the initiate testing operation signal 150 from the wireless automatic test equipment 104. The semiconductor component 200 represents an exemplary embodiment of one of the semiconductor components 106. The semiconductor component 200 performs the self-contained testing operation in response to receiving the initiate testing operation signal 150. After completion of the self-contained testing operation, the semiconductor component 200 wirelessly transmits an individual testing operation outcome 250 of the self-contained testing operation. The individual testing operation outcome 250 represents an exemplary embodiment of one of the testing operation outcomes 152.

The semiconductor component 200 includes a transceiver module 202, an integrated circuit under test 204, and a testing module 206. The transceiver module 202 provides an initiate test control signal 252 based upon the initiate testing operation signal 150 and the individual testing operation outcome 250 based upon an indication of operability 254. More specifically, the transceiver module 202 includes a receiver module 208 and a transmitter module 210. The receiver module 208 downconverts, demodulates, and/or decodes the initiate testing operation signal 150 to provide the initiate test control signal 252. Similarly, the transmitter module 210 encodes, modulates, and/or upconverts the indication of operability 254 in accordance with the multiple access transmission scheme, as discussed above, to provide the individual testing operation outcome 250.

Figure 3:
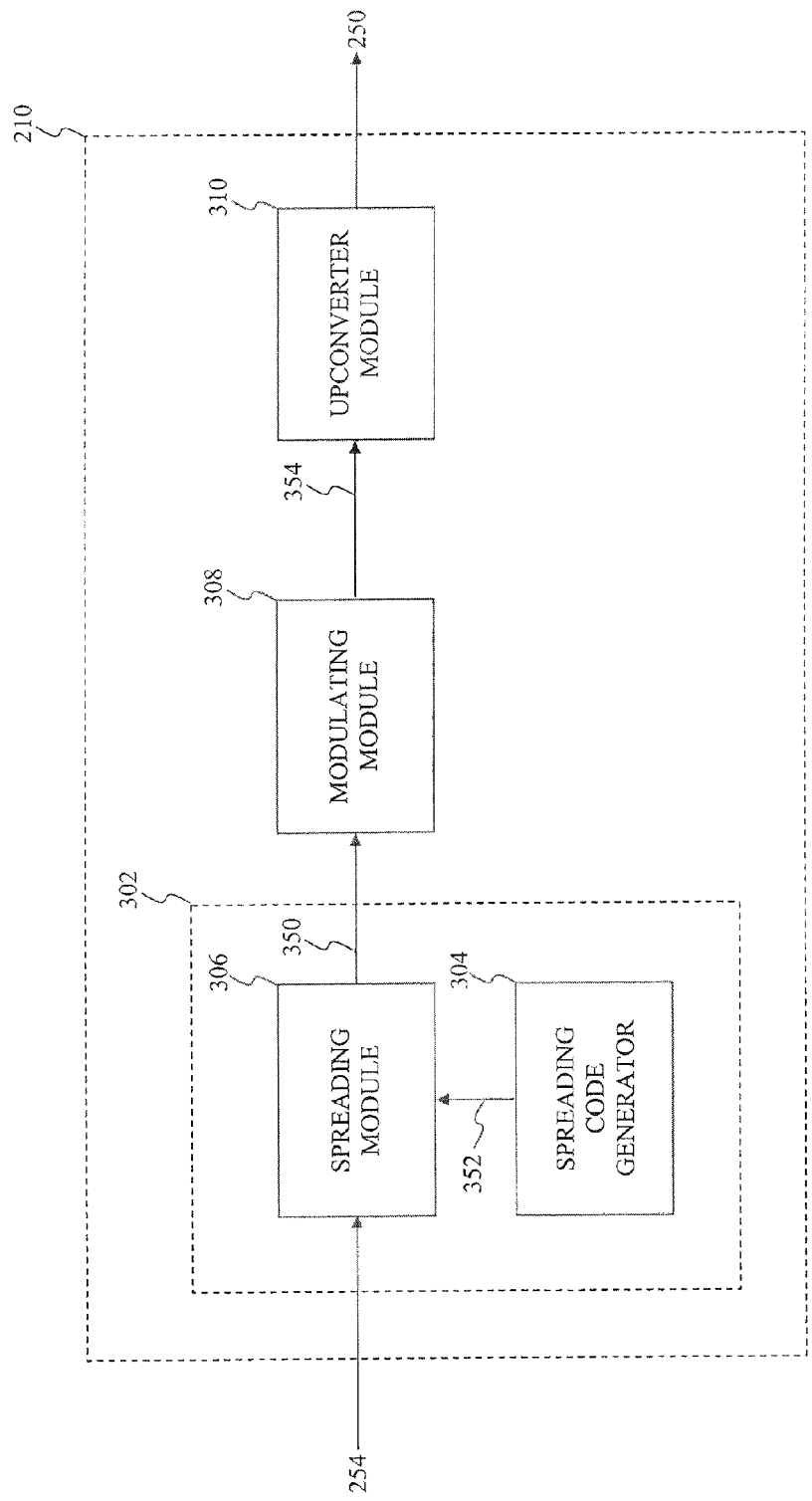
FIG. 3 illustrates a schematic block diagram of a first transmitter module implemented as part of one of the semiconductor components according to a first exemplary embodiment of the present invention.

Exemplary Transmitter Module Implemented as Part of the First Exemplary Semiconductor Component FIG. 3 illustrates a schematic block diagram of a first transmitter module implemented as part of one of the semiconductor components according to a first exemplary embodiment of the present invention. A transmitter module 300 encodes, modulates, and/or upconverts the indication of operability 254 to provide the individual testing operation outcome 250 in accordance with the multiple access transmission scheme, as discussed above. The transmitter module 300 represents an exemplary embodiment of the transmitter module 210.

The transmitter module 300 includes an encoding module 302, a modulating module 308, and an upconverter module 310. The encoding module 302 encodes the indication of operability 254 in accordance with the multiple access transmission scheme to provide an encoded indication of operability 350. In an exemplary embodiment, the encoding module 302 encodes the indication of operability 254 in accordance with a code division multiple access (CDMA) scheme. In this exemplary embodiment, the encoding module 302 includes a spreading code generator 304 and a spreading module 306. The spreading code generator 304 provides a unique random, pseudo-random, and/or non-random sequence of data, referred to as a spreading code 352, to the spreading module 306. The spreading code 352 represents to a sequence of bits that is unique to each of the semiconductor components 106, or groups of the semiconductor components 106, to encode the indication of operability 254. The spreading module 306 utilizes the spreading code 352 to encode the indication of operability 254 to provide the spreaded indication of operability 350.

The modulating module 308 modulates the spreaded indication of operability 350 using any suitable analog or digital modulation techniques such as amplitude modulation (AM), frequency modulation (FM), phase modulation (PM), phase shift keying (PSK), frequency shift keying (FSK), amplitude shift keying (ASK), quadrature amplitude modulation (QAM) and/or any other suitable modulation technique that will be apparent to those skilled in the relevant art(s) to provide a modulated indication of operability 354.

The upconverter module 310 frequency translates or upconverts the modulated indication of operability 354 to provide the individual testing operation outcome 250. More specifically, the upconverter module 310 may upcovert the individual testing operation outcome 250 using a single carrier frequency and/or among multiple carriers to implement the multiple access transmission to provide the individual testing operation outcome 250. In an exemplary embodiment, the upconverter module 310 is optional. In this exemplary embodiment, the modulating module 308 directly provides the modulated indication of operability 354 as the individual testing operation outcome 250.

Referring again to FIG. 2, the testing module 206 provides the self-contained testing operation 256 in response to the initiate test control signal 252. The self-contained testing operation 256 may utilize a first set of parameters provided by the initiate testing operation signal 150 to be used by a first set of instructions that are stored within the testing module 206. Alternatively, the self-contained testing operation 256 may execute a second set of instructions provided by the initiate testing operation signal 150 and/or a second set of parameters to be used by the second set of instructions that are provided by the initiate testing operation signal 150. In another alternate, the self-contained testing operation 256 may include any combination of the first set of instructions, the second set of instructions, the first set of parameters and/or the second set of parameters.

The initiate test control signal 252 causes the testing module 206 to enter into a testing mode of operation. In the testing mode of operation, the testing module 206 may load the first set of instructions and/or the first set of parameters of the self-contained testing operation 256 from one or more memory devices. The testing module 206 may provide the first set of instructions and/or the first set of parameters individually, or as a group, to the integrated circuit under test 204 as the testing routine 256. Alternatively, the testing module 206 may gather the second set of instructions and/or the second set of parameters of the self-contained testing operation 256 from the self-contained testing operation 252. The testing module 206 may provide the second set of instructions and/or the second set of parameters individually, or as a group, to the integrated circuit under test 204 as the testing routine 256. Alternatively, the testing module 206 may provide any combination of the first and the second set of instructions and/or the first and the second set of parameters to the integrated circuit under test 204 as the testing routine 256

The integrated circuit under test 204 executes the self-contained testing operation 256 to determine whether the integrated circuit under test 204 operates as expected. The integrated circuit under test 204 provides an indication of operability 258 during and/or after execution of the self-contained testing operation 256 to the testing module 206. The indication of operability 258 indicates whether the integrated circuit under test 204 operates as expected or, alternatively, whether the integrated circuit under test 204 operates unexpectedly and, optionally, one or more locations within the integrated circuit under test 204 that operate unexpectedly.

The testing module 206 may additionally analyze the indication of operability 258, format the indication of operability 258 by appending a unique identification number of the semiconductor component 200 to the indication of operability 258, or by formatting the indication of operability 258 according to a known communications standard to provide some examples, and/or encode the indication of operability 258 using any suitable error correction coding such as a block code, a convolutional code, and/or any other suitable error correction coding scheme that will be apparent to those skilled in the relevant art(s), before providing the indication of operability 254 to the transceiver module 202. In an exemplary embodiment, the testing module 206 includes a random number generator to generate the unique identification number. However, this exemplary embodiment is not limiting, those skilled in the relevant art(s) will recognize that other methods may be used to generate the unique identification number without departing from the spirit and scope of the present invention. For example, the unique identification number may be generated by wireless automatic test equipment 104 and provided to the semiconductor component 200 using a direct current (DC) probe for storage into a memory device, such as any suitable non-volatile memory, any suitable volatile memory, or any combination of non-volatile and volatile memory that will be apparent to those skilled in the relevant art(s).

In an exemplary embodiment, the testing module 206 only provides the indication of operability 254 to the transceiver module 202 when the indication of operability 258 indicates the integrated circuit under test 204 operates as expected. In this situation, the transceiver module 202 does not provide the individual testing operation outcome 250 when the integrated circuit under test 204 operates unexpectedly. Alternatively, the testing module 206 only provides the indication of operability 254 to the transceiver module 202 when the indication of operability 258 indicates the integrated circuit under test 204 operates unexpectedly. In this situation, the transceiver module 202 does not provide the individual testing operation outcome 250 when the integrated circuit under test 204 operates as expected.

First Exemplary Wireless Automatic Test Equipment

Figure 4:
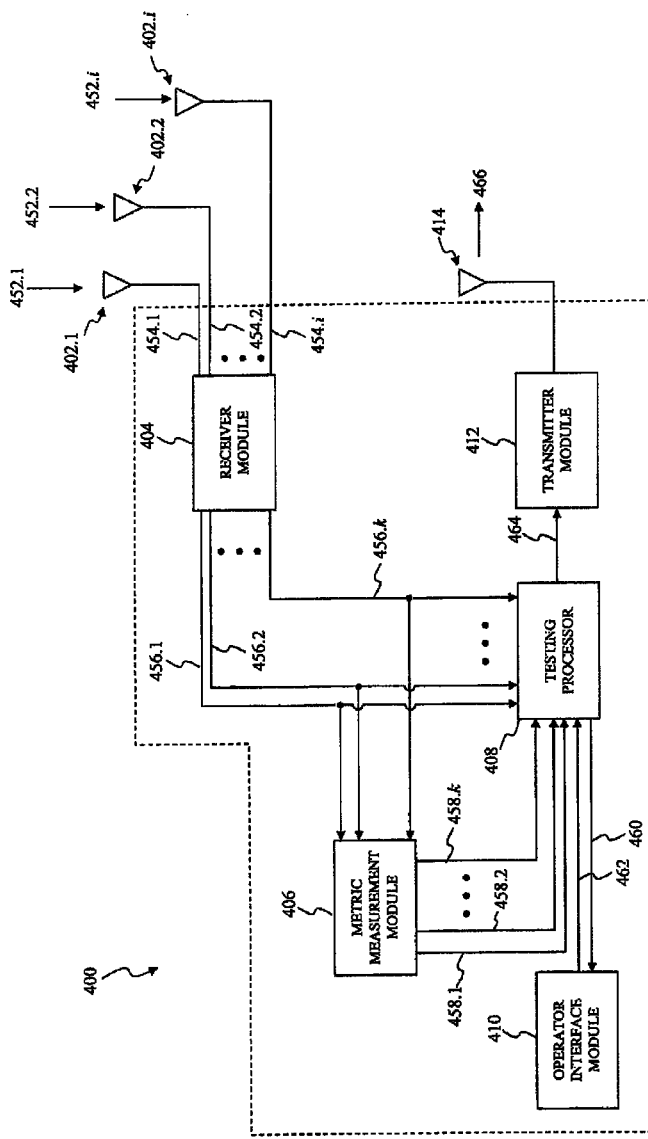
FIG. 4 illustrates a schematic block diagram of a first wireless automatic test equipment according to a first exemplary embodiment of the present invention.

FIG. 4 illustrates a schematic block diagram of a first wireless automatic test equipment according to a first exemplary embodiment of the present invention. The semiconductor components 106 transmit the testing operation outcomes 152 to the wireless automatic test equipment 400 via the common communication channel 154. The wireless automatic test equipment 400 includes one or more receiving antennas to observe the testing operation outcomes 152 from one or more directions in three dimensional space. The wireless automatic test equipment 400 may determine whether one or more of the semiconductor components 106 operate as expected and, optionally, may use properties of the three dimensional space, such as distance between each of multiple receiving antennas and/or the semiconductor components 106 to provide an example, to determine a location of the one or more of the semiconductor components 106 within the semiconductor wafer 102. The wireless automatic test equipment 400 represents an exemplary embodiment of the wireless automatic test equipment 104.

The wireless automatic test equipment 400 includes receiving antennas 402.1 through 402.$i$, a receiver module 404, a metric measurement module 406, a testing processor 408, an operator interface module 410, a transmitter module 412, and a transmitting antenna 414. The receiving antennas 402.1 through 402.$i$, herein referred to as the receiving antennas 402, are positioned at corresponding positions in the three dimensional space. In an exemplary embodiment, the receiving antennas 402 include two receiving antennas, namely a first receiving antenna 402.1 and a second receiving antenna 402.2. In this exemplary embodiment, the first receiving antenna 402.1 and the second receiving antenna 402.2 are placed at a distance of $d_1$ and $d_2$, correspondingly, from a center of the semiconductor wafer 102, the distance $d_1$ and the distance $d_2$ being similar to or dissimilar from each other. In this exemplary embodiment, the first receiving antenna 402.1 is separated from the second receiving antenna 402.2 by an angle $\theta$, such as ninety degrees to provide an example.

Figure 5A:
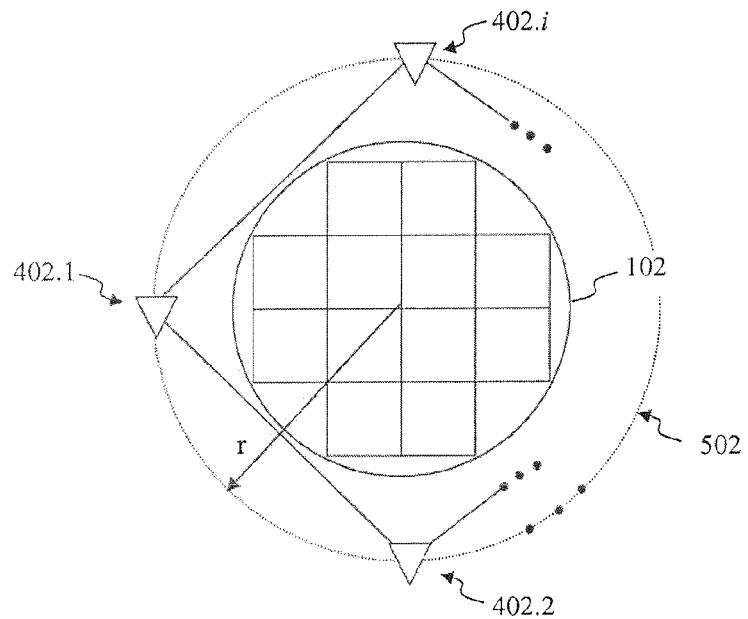
FIG. 5A illustrates a first exemplary positioning of receiving antennas of the wireless automatic test equipment according to a first exemplary embodiment.

First Exemplary Positioning of Receiving Antennas of the Wireless Automatic Test Equipment FIG. 5A illustrates a first exemplary positioning of receiving antennas of the wireless automatic test equipment according to a first exemplary embodiment. As shown in FIG. 5A, the receiving antennas 402 may be placed along a radius r of a spherical shell 502 in the three dimensional space proximate to the semiconductor wafer 102. In an exemplary embodiment, the receiving antennas 402 may form corners of a polygon that is positioned within a plane that intersects the spherical shell 502. The polygon may be characterized as having sides of similar or dissimilar length. However, this example is not limiting, those skilled in the relevant art(s) will recognize that the receiving antennas 402 may be placed along any suitable radius r in one or more planes that intersect the spherical shell 502 without departing from the sprit and scope of the present invention.

Figure 5B:
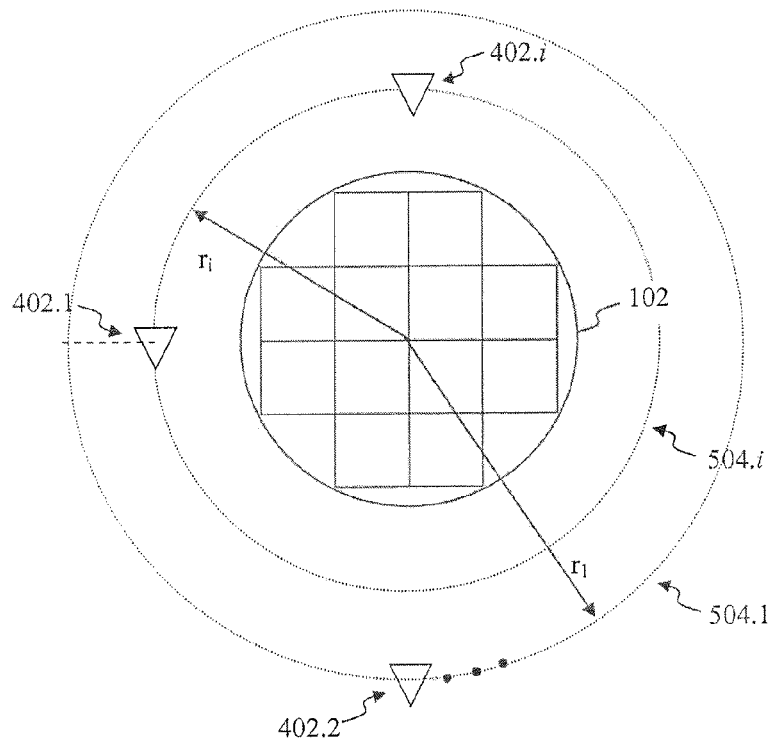
FIG. 5B illustrates a second exemplary positioning of the receiving antennas of the wireless automatic test equipment according to a first exemplary embodiment.

Second Exemplary Positioning of the Receiving Antennas of the Wireless Automatic Test Equipment FIG. 5B illustrates a second exemplary positioning of the receiving antennas of the wireless automatic test equipment according to a first exemplary embodiment. The receiving antennas 402 may be placed along a corresponding radius $r_1$ through $r_i$ of a corresponding spherical shell 504.1 through 504.$i$ in the three dimensional space proximate to the semiconductor wafer 102. For example, the receiving antenna 402.1 may be placed along a radius $r_1$ of a first spherical shell 504.1 in the three dimensional space. Likewise, the receiving antenna 402.$i$ may be placed along a radius $r_n$ of an $i^{th}$ spherical shell 504.$i$ in the three dimensional space. A radius having a greater subscript may be greater than, less than, or equal to a radius having a lesser subscript. For example, the radius $r_n$ may be greater than, less than, or equal to the radius $r_1$.

Although FIG. 5A and FIG. 5B illustrate positioning of the receiving antennas 402 in relation to a spherical shell, those skilled in the relevant art(s) will recognize that any other regular geometric structure, irregular geometric structure, open structure, close structure, or any combination thereof may be used to position the receiving antennas 402 in the three dimensional space without departing from the spirit and scope of the present invention.

Figure 5C:
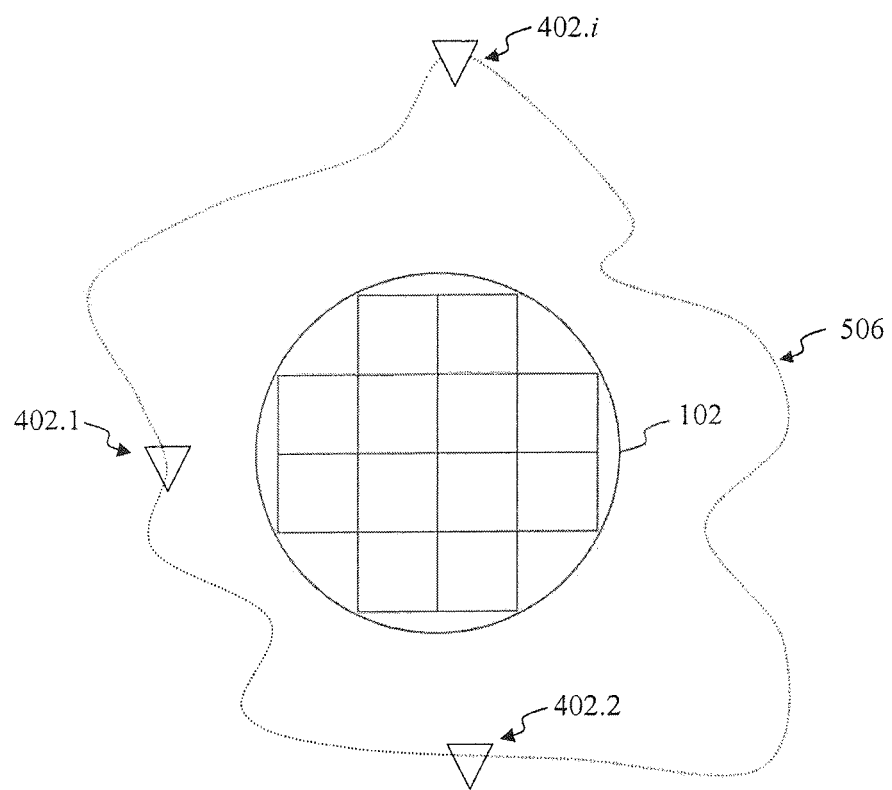
FIG. 5C illustrates a third exemplary positioning of the receiving antennas of the wireless automatic test equipment according to a first exemplary embodiment.

Third Exemplary Positioning of the Receiving Antennas of the Wireless Automatic Test Equipment FIG. 5C illustrates a third exemplary positioning of the receiving antennas of the wireless automatic test equipment according to a first exemplary embodiment. Each of the receiving antennas 402 may be positioned anywhere along a geometric structure 506 in the three dimensional space proximate to the semiconductor wafer 102. The geometric structure 506 may represent an irregular geometric structure, as shown, or any regular geometric structure that will be apparent to those skilled in the relevant art(s). Additionally, the geometric structure 506 may represent a closed structure, as shown, or any open structure that will be apparent to those skilled in the relevant art(s).

Referring again to FIG. 4, the receiving antennas 402 observe testing operation outcomes 452.1 through 452.$i$, herein testing operation outcomes 452, to provide one or more observed testing operation outcomes 454.1 through 454.$i$, herein observed testing operation outcomes 454. The testing operation outcomes 452 represent the testing operation outcomes 152 as they propagate through the common communication channel 154 as observed by the receiving antennas 402 at their corresponding positions in the three-dimensional space. For example, the observed testing operation outcome 454.1 represents the testing operation outcomes 152 as they propagate through the common communication channel 154 as observed by the receiving antenna 402.1 at a first position in the three-dimensional space. Likewise, the observed testing operation outcome 454.2 represents the testing operation outcomes 152 as they propagate through the common communication channel 154 as observed by the receiving antenna 402.2 at a second corresponding position in the three-dimensional space.

The receiver module 404 downconverts, demodulates, and/or decodes the observed testing operation outcomes 454 to provide recovered testing outcomes 456.1 through 456.$k$, herein recovered testing outcomes 456, in accordance with the multiple access transmission scheme, as discussed above. More specifically, the wireless automatic test equipment 400 includes i receiving antennas 402 to observe the testing operation outcomes 152 as they propagate through the common communication channel 154 to provide i observed testing operation outcomes 454. Each of the observed testing operation outcomes 454 includes the testing operation outcomes 152 as observed by its corresponding receiving antenna 402. For example, the observed testing operation outcomes 454.1 includes the testing operation outcomes 152 as observed the receiving antenna 402.1 and the observed testing operation outcomes 454.$i$ includes the testing operation outcomes 152 as observed the receiving antenna 402.$i$.

The receiver module 404 downconverts, demodulates, and/or decodes the observed testing operation outcomes 454 to provide a corresponding recovered testing outcome 456 for each of the n testing operation outcomes 152 for each of the i testing operation outcomes 454 for a total of n*i=k recovered testing outcomes 456. In other words, the receiver module 404 downconverts, demodulates, and/or decodes each of the testing operation outcomes 454 as observed by each of the receiving antennas 402. In an exemplary embodiment, the testing operation outcome 456.1 represents the testing operation outcome 152.1 as observed by the receiving antenna 402.1, the testing operation outcome 456.2 represents the testing operation outcome 152.2 as observed by the receiving antenna 402.1. In this exemplary embodiment, the testing operation outcome 456.k represents the testing operation outcome 152.n as observed by the receiving antenna 402.i.

Figure 6:
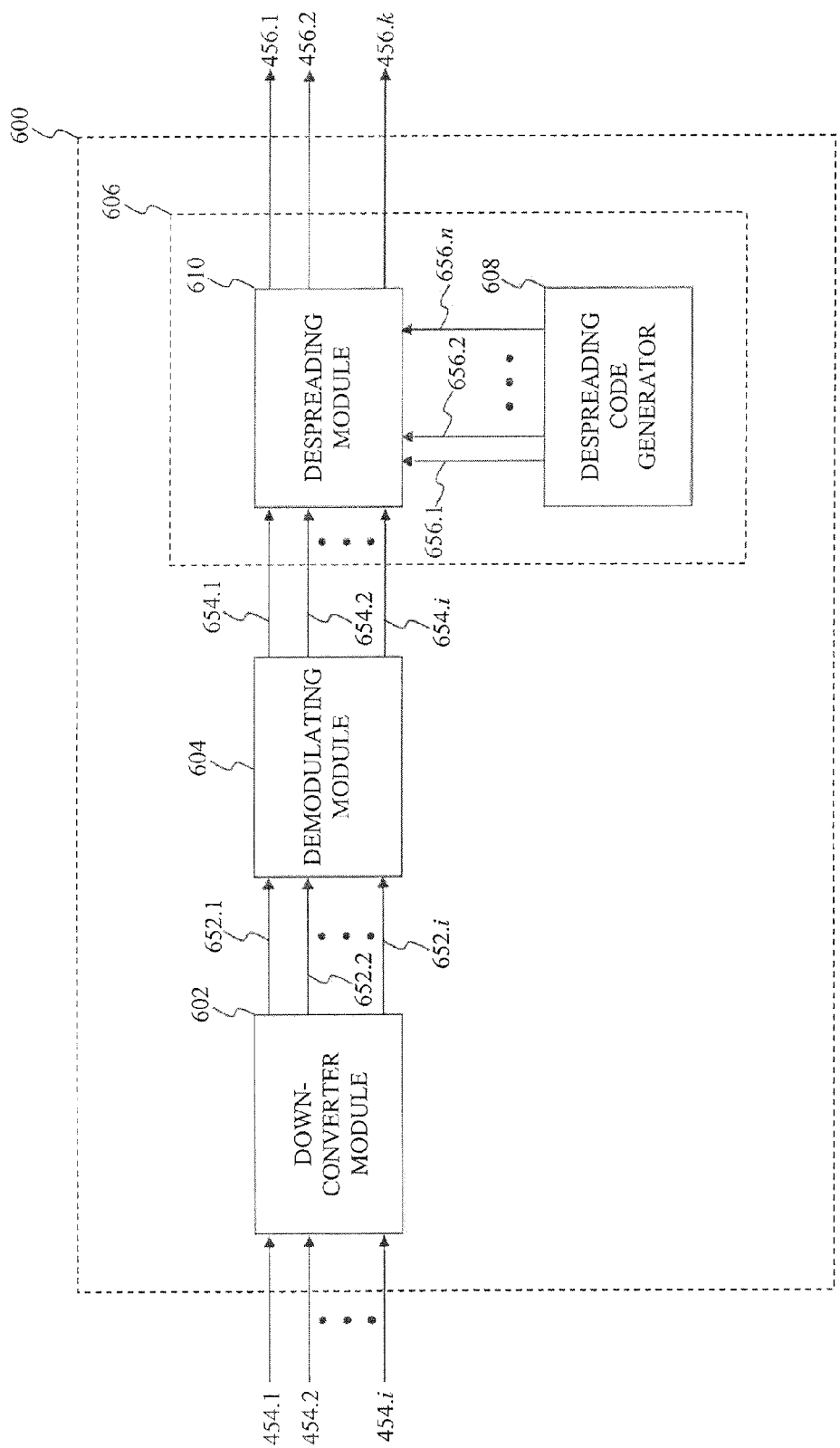
FIG. 6 illustrates a schematic block diagram of a receiver module implemented as part of the wireless automatic test equipment according to an exemplary embodiment of the present invention.

Exemplary Receiver Module Implemented as Part of the Wireless Automatic Test Equipment FIG. 6 illustrates a schematic block diagram of a receiver module implemented as part of the wireless automatic test equipment according to an exemplary embodiment of the present invention. A receiver module 600 downconverts, demodulates, and/or decodes the observed testing operation outcomes 454 to provide the recovered testing outcomes 456 in accordance with the multiple carrier access transmission scheme. The receiver module 600 represents an exemplary embodiment of the receiver module 404.

The receiver module 600 includes a downconverter module 602, a demodulating module 604, and a decoding module 606. The downconverter module 602 frequency translates or downconverts the observed testing operation outcomes 454 to a baseband frequency or an intermediate frequency (IF) to provide downconverted testing operation outcomes 652.1 through 652.i, herein downconverted testing operation outcomes 652. More specifically, the downconverter module 602 may downconvert the observed testing operation outcomes 454 using a single carrier frequency to implement the single carrier multiple access transmission scheme or among multiple carriers to implement the multiple carrier multiple access transmission scheme to provide the downconverted testing operation outcomes 652. In an exemplary embodiment, the downconverter module 602 is optional. In this exemplary embodiment, the demodulating module 604 directly observes the observed testing operation outcomes 454.

The demodulating module 604 demodulates the downconverted testing operation outcomes 652 using any suitable analog or digital demodulation technique for any suitable modulation technique such as amplitude modulation (AM), frequency modulation (FM), phase modulation (PM), phase shift keying (PSK), frequency shift keying (FSK), amplitude shift keying (ASK), quadrature amplitude modulation (QAM) and/or any other suitable modulation technique that will be apparent to those skilled in the relevant art(s) to provide demodulated testing operation outcomes 654.1 through 654.i, herein demodulated testing operation outcomes 654.

The decoding module 606 decodes the demodulated testing operation outcomes 654 using any suitable multiple access transmission scheme to provide the recovered testing outcomes 456. In an exemplary embodiment, the decoding module 606 decodes the demodulated testing operation outcomes 654 in accordance with a code division multiple access (CDMA) scheme. In this exemplary embodiment, the decoding module 606 includes a despreading code generator 608 and a despreading module 610. The despreading code generator 608 provides unique random, pseudo-random, and/or non-random sequences of data, referred to as despreading codes 656.1 through 656.n, to the despreading module 610. Each of the despreading codes 656.1 through 656.n represent a corresponding one of the spreading codes that were used to by the semiconductor components 106 to provide their corresponding testing operation outcome 152. For example, the despreading code 656.1 represents the spreading code used by the semiconductor component 106.1 to provide the testing operation outcome 152.1. The despreading code module 610 utilizes the despreading codes 656.1 through 656.n to decode the demodulated testing operation outcomes 654 to provide a total of n*i=k recovered testing outcomes 456.

Referring again to FIG. 4, the metric measurement module 406 determines one or more signal metrics of the recovered testing outcomes 456 to provide measured signal metrics 458.1 through 458.k, herein measured signal metrics 458. The one or more signal metrics may include a mean, a total energy, an average power, a mean square, an instantaneous power, a root mean square, a variance, a norm, a voltage level and/or any other suitable signal metric of the recovered testing outcomes 456 that will be apparent by those skilled in the relevant art(s) without departing from the spirit and scope of the present invention.

The testing processor 408 may determine a first group of semiconductor components from among the semiconductor components 106 that operate as expected based upon the recovered testing outcomes 456. The testing processor 408 evaluates the recovered testing outcomes 456 for each of the unique identification numbers to determine whether its corresponding semiconductor component 106 is part of the first group of semiconductor components. Alternatively, the testing processor 408 may determine the first group of semiconductor components based upon the recovered testing outcomes 456.1 through 456.i that correspond to the first receiving antenna 402.1, based upon the recovered testing outcomes 456.(k−i) through 456.k that correspond to the $i^{th}$ receiving antenna 402.i, or any suitable combination of antennas that will be apparent to those skilled in the relevant art(s) without departing from the spirit and scope of the present invention. Alternatively, the testing processor 408 may determine a second group of semiconductor components from among the semiconductor components 106 that operate unexpectedly based upon the recovered testing outcomes 456. In another alternate, the testing processor 408 may determine any combination of the first group of semiconductor components and the second group of semiconductor components.

In an exemplary embodiment, the testing processor 408 may provide the testing operation command signal 464 to the transmitter module 412 that causes the transmitter module 412 to provide the initiate testing operation signal 466 that causes those semiconductor components 106 that operate as expected to enter into a transmitting state and those semiconductor components 106 that operate unexpectedly to enter into a non-transmitting state. Alternatively, the testing processor 408 may provide the testing operation command signal 464 to the transmitter module 412 that causes the transmitter module 412 to provide the initiate testing operation signal 466 that causes those semiconductor components 106 that operate unexpectedly to enter into a transmitting state and those semiconductor components 106 that operate as expected to enter into a non-transmitting state. In these exemplary embodiments, only those semiconductor components 106 that are in the transmitting state provide their respective testing operation outcome 152.

The testing processor 408 may, optionally, determine a location of the semiconductor components 106 within the semiconductor wafer 102 based upon the measured signal metrics 458. The testing processor 408 may determine the location of each of the semiconductor components 106, those semiconductor components 106 in the transmitting state, those semiconductor components 106 in the non-transmitting state, and/or any combination thereof.

First Exemplary Mapping of the Testing Operation Outcomes

FIG. 7 graphically illustrates a first transmission field pattern 700 of more than one of the semiconductor components according to an exemplary embodiment of the present invention. As discussed above, the semiconductor components 106 communicate the testing operation outcomes 152 over the common communication channel 154 to the wireless automatic test equipment 400.

A first semiconductor component 702.1 transmits a first testing operation outcome 752.1 using a first antenna, such as a dipole antenna, over the common communication channel 154 in accordance with the multiple access scheme. However this example is not limiting, those skilled in the relevant art(s) will recognize that other types of antenna such as a random wire antenna, a horn, a parabolic antenna, a patch antenna, or any other suitable antenna that is capable of converting an electromagnetic wave into a current to provide some examples, or combinations of antenna may be utilized by the first semiconductor component 702.1. The first testing operation outcome 752.1 propagates through the common communication channel 154 to a first receiving antenna 402.1 and a second receiving antenna 402.2 as illustrated by a first field pattern 704.1. Those skilled in the relevant art(s) will recognize that more receiving antennas 402 may be utilized, as shown in FIG. 5A through 5C, without departing from the spirit and scope of the present invention.

Likewise, a second semiconductor component 702.2 substantially simultaneously transmits a second testing operation outcome 752.2 using a second antenna over the common communication channel 154 in accordance with the multiple access scheme. The second testing operation outcome 752.2 propagates through the common communication channel 154 to the first receiving antenna 402.1 and the second receiving antenna 402.2 as illustrated by a second field pattern 704.2.

The first semiconductor component 702.1 and the second semiconductor component 702.2 represent exemplary embodiments of any two of the semiconductor components 106. Likewise, the first testing operation outcome 752.1 and the second testing operation outcome 752.2 represent exemplary embodiments of any two of the testing operation outcomes 152.

Placement of the first receiving antenna 402.1 at a distance $d_1$ from the semiconductor wafer 102 in the three dimensional space and the second receiving antenna 402.2 at a distance $d_2$ in the three dimensional space from the semiconductor wafer 102 allows the wireless automatic test equipment 400 to determine that the first testing operation outcome 752.1 is being provided by the first semiconductor component 702.1 and the second testing operation outcome 752.2 is being provided by the second semiconductor component 702.2. More specifically, the one or more signal metrics of the first testing operation outcome 752.1 and the second testing operation outcome 752.2 deviate as they propagate through the common communication channel 154. For example, the first testing operation outcome 752.1 and the second testing operation outcome 752.2 as observed by the first receiving antenna 402.1 will be substantially similar since the first semiconductor component 702.1 and the second semiconductor component 702.2 are substantially equidistant from the first receiving antenna 402.1. As a result, the one or more signal metrics of the first testing operation outcome 752.1 and the one or more signal metrics of the second testing operation outcome 752.2 will be substantially similar allowing the wireless automatic test equipment 400 to determine that the first semiconductor component 702.1 and the second semiconductor component 702.2 are equidistant from the first receiving antenna 402.1.

However, the first testing operation outcome 752.1 and the second testing operation outcome 752.2 as observed by the second receiving antenna 402.2 will not be substantially similar since the first semiconductor component 702.1 and the second semiconductor component 702.2 are not equidistant from the second receiving antenna 402.2. For example, the one or more signal metrics of the first testing operation outcome 752.1 along the radius $r_1$ are less than the one or more signal metrics of the second testing operation outcome 752.2 along the radius $r_2$. As a result, the one or more signal metrics of the first testing operation outcome 752.1 and the one or more signal metrics of the second testing operation outcome 752.2 will differ allowing the wireless automatic test equipment 400 to determine that the first semiconductor component 702.1 and the second semiconductor component 702.2 are not equidistant from the second receiving antenna 402.2. Rather, the first semiconductor component 702.1 is farther away from the second receiving antenna 402.2 when compared to the second semiconductor component 702.2.

Referring again to FIG. 4, the testing processor 408 assigns the recovered testing outcomes 456 to corresponding coordinates from among i sets of coordinates in the three dimensional space to determine the location of the semiconductor components 106 within the semiconductor wafer 102. For example, in an embodiment of the wireless automatic test equipment 400 having a first receiving antenna 402.1 and a second receiving antenna 402.2, the first receiving antenna 402.1 and the second receiving antenna 402.2 observe the testing operation outcome 452.1 and the testing operation outcome 452.2, correspondingly. In this example, the testing processor 408 designates the measured signal metrics 458.1 and 458.$i$ that correspond to the first receiving antenna 402.1 as a first coordinate for each of the i sets of coordinates in the three dimensional space. Similarly, the testing processor 408 designates the measured signal metrics 458.($i$+1) and 458.$k$ that correspond to the second receiving antenna 402.2 as a second coordinate for each of the i sets of coordinates in the three dimensional space.

The testing processor 408 extracts the unique identification number for each of the semiconductor components 106 from the recovered testing outcomes 456, or a subset of, from the recovered testing outcomes 456, such as the recovered testing outcomes 456.1 through 456.$i$ to provide an example. The testing processor 408 assigns the unique identification number for each of the semiconductor components 106 that is embedded within the testing operation outcomes 452 to the i sets of coordinates.

The testing processor 408 maps the unique identification numbers to their corresponding semiconductor component 106 to determine the location of the semiconductor components 106 within the semiconductor wafer 102. The testing processor 408 may determine the location of the semiconductor components 106 within the semiconductor wafer 102 by comparing the measured signal metrics 458 corresponding to each of the unique identification number to predetermined signal metrics for each of the semiconductor components 106. The predetermined signal metrics represent expected values of the measured signal metrics 458. For example, one or more predetermined signal metrics, or range of signal metrics, for each of the semiconductor components 106 are determined prior to the testing operation. The testing processor 408 may compare the i sets of coordinates for the unique identification numbers to the one or more predetermined signal metric for each of the semiconductor components 106 to effectively map the unique identification numbers to the semiconductor components 106. Alternatively, the testing processor 408 may iteratively interpolate the location of the unique identification numbers to the semiconductor components 106 within the semiconductor wafer 102 based upon relationships between their corresponding measured signal metrics 458. For example, if a first coordinate from among a first set of coordinates that is assigned to a first unique identification number is greater than a first coordinate from among a second set of coordinates that is assigned to a second unique number, then the semiconductor component 106 that provided the first unique identification number is closer to the first receiving antenna 402.1 when compared to the semiconductor component 106 that provided the second unique number. As another example, if the first coordinate from among the first set of coordinates is less than a first coordinate from among a third set of coordinates that is assigned to a third unique identification number, then the semiconductor component 106 that provided the first unique identification number is further from the first receiving antenna 402.1 when compared to the semiconductor component 106 that provided the third unique identification number.

The testing processor 408 may provide a listing of testing results 460 to the operator interface module 410. The listing of testing results 460 may indicate whether at least one the semiconductor components 106 operate as expected, and optionally their location within the semiconductor wafer 102, whether at least one of the semiconductor components 106 operate unexpected, and optionally their location within the semiconductor wafer 102, or any combination thereof. Alternatively, the testing processor 408 may store the listing of test results 460 within an internal memory. In another alternate, the listing of testing results 460 may include a first indication that all of the semiconductors 106 that operate as expected and/or a second indication that indicates at least one of the semiconductor components 106 operate unexpectedly.

The operator interface module 410 may further process the listing of testing results 460 for display on a graphical user interface. For example, the operator interface module 410 may display the listing of testing results 460 on a video monitor for interpretation by an end user. Alternatively, the operator interface module 410 may provide the listing of testing results 460 to the end user. For example, the operator interface module 410 may record the listing of testing results 460 onto a digital recording medium. In another alternate, the operator interface module 410 may store the listing of testing results 460 for future recovery by the end user.

The operator interface module 410 additionally observes an indication from the end user the initiate the self-contained testing operation, whereby the operator interface module sends an initiate self-contained testing operation 462 to the testing processor 408 to initiate the self-contained testing operation. The end user may additionally specify the second set of instructions to be performed and/or the second set of parameters to be used by the second set of instructions prior to initiating the self-contained testing operation. Alternatively, the testing processor 408 may load the second set of instructions and/or the second set of parameters from the internal memory. The operator interface module 410 provides the second set of instructions and/or the second set of parameters to the testing processor 408 as part of the initiate self-contained testing operation 462.

The transmitter module 412 receives the initiate self-contained testing operation 462 from the testing processor 408 via an initiate self-contained testing operation 464. The transmitter module 412 encodes, modulates and/or upconverts the testing operation command signal 464 to provide an initiate testing operation signal 466 to the semiconductor wafer 102 via a transmitting antenna 414. In an exemplary embodiment, the transmitter module 412 wirelessly sends the initiate testing operation signal 466 to all of the semiconductor components 106 within the semiconductor wafer 102. However, this example is not limiting, those skilled in the relevant art(s) will recognize that the initiate testing operation signal 466 may be sent to a lesser number of the semiconductor components 106 within the semiconductor wafer 102 without departing from the spirit and scope of the present invention. The initiate testing operation signal 466 represents an exemplary embodiment of the initiate testing operation signal 150.

Second Exemplary Wireless Component Testing Environment

As an alternate to the semiconductor mapping as described above, each of the one or more semiconductor components is tagged at manufacturing, during testing, or implementation in the field with a unique identification number. The unique identification number represents a series of bits that is unique to each of the one or more semiconductor components.

FIG. 8 illustrates a schematic block diagram of a second wireless component testing environment according to a second exemplary embodiment of the present invention. A wireless testing environment 800 allows for simultaneous testing of the semiconductor components 106 by wireless automatic test equipment 802. The wireless automatic test equipment 802 wirelessly tests one or more of the semiconductor components 106 simultaneously to verify that these one or more of the semiconductor components 106 operate as expected.

The wireless automatic test equipment 802 sends initiate testing operation signals 850.1 through 850.$n$, herein initiate testing operation signals 850, to the semiconductor components 106. The initiate testing operation signals 850 represent one or more radio communication signals that are wirelessly transmitted using the common communication channel 154 to the semiconductor components 106 using one or more transmitting antennas positioned in three-dimensional space as described above in FIG. 5A through FIG. 5C. The wireless automatic test equipment 802 may serially provide the initiate testing operation signals 850 or, alternatively, simultaneously provide the initiate testing operation signals 850 using a multiple access transmission scheme. In an exemplary embodiment, the wireless automatic test equipment 802 may encode each of the initiate testing operation signals 850 using a different spreading code in accordance with code division multiple access (CDMA) scheme. For example, the wireless automatic test equipment 802 may encode a first initiate testing operation signal 850.1 and a second initiate testing operation signal 850.2 using a first spreading code and a second spreading code, correspondingly, and simultaneously provide the first initiate testing operation signal 850.1 and the second initiate testing operation signal 850.2 to the semiconductor components 106 over the common communication channel 854.

One or more of the semiconductor components 106 observe the initiate testing operation signals 850 as they pass through the common communication channel 854. These semiconductor components 106 determine one or more signal metrics, such as a mean, a total energy, an average power, a mean square, an instantaneous power, a root mean square, a variance, a norm, a voltage level and/or any other suitable signal metric that will be apparent by those skilled in the relevant art(s) provide some examples, of the initiate testing operation signals 850. The semiconductor components 106 utilize the one or more signal metrics to generate a unique identification number, or tag, which may be used by the wireless automatic test equipment 802 to determine a location of the semiconductor components 106 within the semiconductor wafer 102. The semiconductor components 106 may store their corresponding unique identification number into one or more memory devices such as any suitable non-volatile memory, any suitable volatile memory, or any combination of non-volatile and volatile memory that will be apparent by those skilled in the relevant art(s) without departing from the spirit and scope of the present invention.

The semiconductor components 106 that received the initiate testing operation signals 850 enter into a testing mode of operation, whereby these semiconductor components 106 execute the self-contained testing operation as described above. After completion of the self-contained testing operation, the semiconductor components 106 wirelessly transmit a testing operation outcome 852 to the wireless automatic test equipment 802 via the common communication channel 854. Collectively, the semiconductor components 106 communicate the testing operation outcome 852 over the common communication channel 154 using the multiple access transmission scheme as described above. The testing operation outcome 852 includes the unique identification number for each of the semiconductor components 106 to allow the wireless automatic test equipment 802 to determine the location of the semiconductor components 106 within the semiconductor wafer 102.

The wireless automatic test equipment 802 observes the testing operation outcome 852 as it passes through the common communication channel using a receiving antenna positioned in the three-dimensional space. The wireless automatic test equipment 802 determines a first group of semiconductor components from among the semiconductor components 106 that operate as expected, and optionally their location within the semiconductor wafer 102, based upon the testing operation outcome 852 as observed by the receiving antenna. Alternatively, the wireless automatic test equipment 802 may determine a second group of semiconductor components from among the semiconductor components 106 that operate unexpectedly based upon the testing operation outcome 852 as observed by the receiving antenna. The wireless automatic test equipment 802 may, optionally, provide a location of the second group of semiconductor components within the semiconductor wafer 102. In another alternate, the wireless automatic test equipment 104 may determine any combination of the first group of semiconductor components and the second group of semiconductor components and, optionally, provide their corresponding locations within the semiconductor wafer 102.

Second Exemplary Semiconductor Component

FIG. 9 illustrates a schematic block diagram of a second semiconductor component according to a first exemplary embodiment of the present invention. A semiconductor component 900 observes the initiate testing operation signals 850 from the wireless automatic test equipment 802. The semiconductor component 900 represents an exemplary embodiment of one of the semiconductor components 106. The semiconductor component 900 determines one or more signal metrics of the initiate testing operation signals 850 to generate a unique identification number, or tag, that may be used by the wireless automatic test equipment 802 to determine a location of the semiconductor components 106 within the semiconductor wafer 102. The semiconductor component 900 performs the self-contained testing operation in response to receiving the initiate testing operation signals 850. After completion of the self-contained testing operation, the semiconductor component 900 wirelessly transmits an individual testing operation outcome 950 of the self-contained testing operation. The individual testing operation outcome 950 represents an exemplary embodiment of one of the testing operation outcomes 852.

The semiconductor component 900 includes the integrated circuit under test 214, a transceiver module 902, a metric measurement module 904, and a testing module 906. The transceiver module 902 provides initiate test control signals 952.1 through 952.$i$, herein initiate test control signals 952.1, based upon the initiate testing operation signals 850 and the individual testing operation outcome 950 based upon the indication of operability 254. More specifically, the transceiver module 902 includes a receiver module 908 and a transmitter module 910. The receiver module 908 downconverts, demodulates, and/or decodes the initiate testing operation signals 850 to provide the initiate test control signals 952.

Exemplary Receiver Module Implemented as Part of the Second Exemplary Semiconductor Component FIG. 10 illustrates a schematic block diagram of a receiver module implemented as part of the second exemplary semiconductor component according to an exemplary embodiment of the present invention. A receiver module 1000 downconverts, demodulates, and/or decodes the initiate testing operation signals 850 to provide the initiate test control signals 952 in accordance with the multiple access transmission scheme. The receiver module 1000 represents an exemplary embodiment of the receiver module 908.

The receiver module 1000 includes a downconverter module 1002, a demodulating module 1004, and a decoding module 1006. The downconverter module 1002 frequency translates or downconverts the initiate testing operation signals 850 to a baseband frequency or an intermediate frequency (IF) to provide downconverted testing operation outcomes 1052.1 through 1052.$i$, herein downconverted testing operation outcomes 1052. More specifically, the downconverter module 1002 may downconvert the initiate testing operation signals 850 using a single carrier frequency to implement the single carrier multiple access transmission scheme or among multiple carriers to implement the multiple carrier multiple access transmission scheme to provide the downconverted testing operation outcomes 1052. In an exemplary embodiment, the downconverter module 1002 is optional. In this exemplary embodiment, the demodulating module 1004 directly observes the initiate testing operation signals 850.

The demodulating module 1004 demodulates the downconverted testing operation outcomes 1052 using any suitable analog or digital demodulation technique for any suitable modulation technique such as amplitude modulation (AM), frequency modulation (FM), phase modulation (PM), phase shift keying (PSK), frequency shift keying (FSK), amplitude shift keying (ASK), quadrature amplitude modulation (QAM) and/or any other suitable modulation technique that will be apparent to those skilled in the relevant art(s) to provide demodulated testing operation outcomes 1054.1 through 1054.$i$, herein demodulated testing operation outcomes 1054.

The decoding module 1006 decodes the demodulated testing operation outcomes 1054 using any suitable multiple access transmission scheme to provide the initiate test control signals 952. In an exemplary embodiment, the decoding module 1006 decodes the demodulated testing operation outcomes 1054 in accordance with a code division multiple access (CDMA) scheme. In this exemplary embodiment, the decoding module 1006 includes a despreading code generator 1008 and a despreading module 1010. The despreading code generator 1008 provides unique random, pseudo-random, and/or non-random sequences of data, referred to as despreading codes 1056.1 through 1056.$n$, to the despreading module 1010. Each of the despreading codes 1056.1 through 1056.$n$ represent a spreading code that corresponds to each of the initiate testing operation signals 850. For example, the despreading code 1056.1 represents the spreading code used by the wireless automatic test equipment 802 to provide the initiate testing operation signal 850.1. The despreading code module 1010 utilizes the despreading codes 1056.1 through 1056.*n* to decode the demodulated testing operation outcomes 1054 to provide a total of n*i=k initiate test control signals 952.

Referring again to FIG. 9, the transmitter module 210 encodes, modulates, and/or upconverts the indication of operability 254 in accordance with the multiple access transmission scheme to provide the individual testing operation outcome 950, as discussed above.

The metric measurement module 904 determines one or more signal metrics of the initiate test control signals 952 to provide measured signal metrics 954.1 through 954.*k*, herein measured signal metrics 954. The one or more signal metrics may include a mean, a total energy, an average power, a mean square, an instantaneous power, a root mean square, a variance, a norm, a voltage level and/or any other suitable signal metric of the initiate test control signals 952 that will be apparent by those skilled in the relevant art(s) without departing from the spirit and scope of the present invention.

The testing module 906 operates in a substantially similar manner as the testing module 216; therefore only differences between the testing module 216 and the testing module 906 are to be discussed in further detail. The testing module 906 utilizes the measured signal metrics 954 to generate a unique identification number, or tag, which corresponds to the semiconductor component 900. Specifically, the measured signal metrics 954 for each of the semiconductor components 900 within the semiconductor wafer 106 may differ as a result of differences in distances between each of the semiconductor components 900 and the one or more transmitting antennas that provide the initiate testing operation signals 850. The testing module 906 may quantify the measured signal metrics 954 to generate the unique identification number. For example, in an embodiment of the wireless automatic test equipment 802 having a first transmitting antenna and a second transmitting antenna, the testing module 906 may quantify the measured signal metric 954.1 corresponding to the initiate testing operation signal 850.1 provided by the first transmitting antenna as r bits of an s bit unique identification number and the measured signal metric 954.2 corresponding to the initiate testing operation signal 850.2 provided by the second transmitting antenna as t bits of the s bit unique identification number. The testing module 906 may quantify the measured signal metrics 954 using a look-up table, an analog to digital converter (ADC), or any other suitable means that will be apparent to those skilled in the relevant art(s) without departing from the spirit and scope of the present invention. The testing module 906 may store the unique identification number into one or more memory devices such as any suitable non-volatile memory, any suitable volatile memory, or any combination of non-volatile and volatile memory that will be apparent by those skilled in the relevant art(s) without departing from the spirit and scope of the present invention.

The testing module 906 may additionally append the unique identification number stored in the one or more memory devices as a header to the indication of operability 258, or within the indication of operability 258, before providing the indication of operability 254 to the transceiver module 902.

In an exemplary embodiment, the testing module 906 only provides the indication of operability 254 to the transceiver module 202 when the indication of operability 258 indicates the integrated circuit under test 204 operates as expected. In this situation, the transceiver module 202 does not provide the individual testing operation outcome 950 when the integrated circuit under test 204 operates unexpectedly. Alternatively, the testing module 906 only provides the indication of operability 254 to the transceiver module 202 when the indication of operability 258 indicates the integrated circuit under test 204 operates unexpectedly. In this situation, the transceiver module 202 does not provide the individual testing operation outcome 950 when the integrated circuit under test 204 operates as expected.

Second Exemplary Wireless Automatic Test Equipment

FIG. 11 illustrates a schematic block diagram of a second wireless automatic test equipment according to a first exemplary embodiment of the present invention. The wireless automatic test equipment 1100 includes one or more transmitting antennas to provide the initiate testing operation signals 850 to the semiconductor components 106 via one or more directions in three dimensional space via the common communication channel 154. The wireless automatic test equipment 1100 includes a receiving antenna to observe the testing operation outcomes 852 in the three dimensional space. The wireless automatic test equipment 1100 may determine whether one or more of the semiconductor components 106 operate as expected and, optionally, may determine a location of the one or more of the semiconductor components 106 within the semiconductor wafer 102 using unique identification number embedded within the testing operation outcomes 852. The wireless automatic test equipment 1100 represents an exemplary embodiment of the wireless automatic test equipment 104.

The wireless automatic test equipment 1100 includes the operator interface module 410, a receiving antenna 1102, a receiver module 1104, a testing processor 1106, a transmitter module 1108, and transmitting antennas 1110.1 through 1110.*i*. The receiving antenna 1102 observes the testing operation outcome 852 as it passes through the common communication channel 154 to provide an observed testing operation outcome 1152. Alternatively, the wireless automatic test equipment 1100 may include multiple receiving antennas 1102.1 through 1102.*i* that are substantially similar to the receiving antennas 402 as discussed above to observe the testing operation outcome 852 it passes through the common communication channel 154 at corresponding positions in the three dimensional space to provide observed testing operation outcomes 1152.1 through 1152.*i*.

The receiver module 1104 downconverts, demodulates, and/or decodes the observed testing operation outcome 1152 to provide recovered testing outcomes 1154.1 through 1154.*i*, herein recovered testing outcomes 1154, in accordance with the multiple access transmission scheme, as discussed above. In an exemplary embodiment, the receiver module 1104 may be implemented in a substantially manner as the receiver module 600. In this exemplary embodiment, the receiver module 600 is implemented using a single input, namely the observed testing operation outcome 1152, to provide multiple outputs, namely the recovered testing outcomes 1154.

The testing processor 1106 may determine a first group of semiconductor components from among the semiconductor components 106 that operate as expected based upon the recovered testing outcomes 1154. Alternatively, the testing processor 1106 may determine a second group of semiconductor components from among the semiconductor components 106 that operate unexpectedly based upon the recovered testing outcomes 1154. In another alternate, the testing processor 1106 may determine any combination of the first group of semiconductor components and the second group of semiconductor components.

In an exemplary embodiment, the testing processor 1106 may provide the testing operation command signal 1156 to the transmitter module 1108 that causes the transmitter module 1108 to provide the initiate testing operation signals 850 that causes those semiconductor components 106 that operate as expected to enter into a transmitting state and those semiconductor components 106 that operate unexpectedly to enter into a non-transmitting state. Alternatively, the testing processor 1106 may provide the testing operation command signal 1156 to the transmitter module 1108 that causes the transmitter module 1108 to provide the initiate testing operation signals 850 that causes those semiconductor components 106 that operate unexpectedly to enter into a transmitting state and those semiconductor components 106 that operate as expected to enter into a non-transmitting state. In these exemplary embodiments, only those semiconductor components 106 that are in the transmitting state provide their respective testing operation outcome 852.

The testing processor 1106 may, optionally, determine a location of the semiconductor components 106 within the semiconductor wafer 102 based upon the unique identification number for each of the semiconductor components 106 that is embedded within the testing operation outcome 852. The testing processor 1106 may determine the location of each of the semiconductor components 106, those semiconductor components 106 in the transmitting state, those semiconductor components 106 in the non-transmitting state, and/or any combination thereof. The testing processor 1106 may assemble a map indicating the location of the semiconductor components 106 within the semiconductor wafer 102 by comparing the unique identification numbers to a predetermined mapping of the unique identification numbers to their respective locations within the semiconductor wafer 102. Alternatively, the testing processor 1106 may iteratively interpolate the location of the semiconductor components 106 within the semiconductor wafer 102 based upon relationships between the unique identification numbers for each of the semiconductor components 106. For example, the unique identification numbers embedded within the testing operation outcome 852 may include a first unique identification number and a second unique identification number. In this example, the testing processor 1106 may compare the first r bits of the first unique identification number with the first r bits of the second unique identification number. If the first r bits of the first unique identification number are greater than the first r bits of the second unique identification number, then the semiconductor component 106 that corresponds to the first unique identification is closer to the receiving antenna 1102 when compared to the semiconductor component 106 that corresponds to the second unique identification. As another example, if the first r bits of the first unique identification number are less than the first r bits of the second unique identification number, then the semiconductor component 106 that corresponds to the first unique identification is farther from the receiving antenna 1102 when compared to the semiconductor component 106 that corresponds to the second unique identification.

The transmitter module 1108 receives an testing operation command signal 1156 from the testing processor 1106. The transmitter module 1108 encodes, modulates and/or upconverts the testing operation command signal 1156 to provide initiate testing operation signals 1158.1 through 1158.*i*.

Exemplary Transmitter Module Implemented as Part of the Second Exemplary Wireless Automatic Test Equipment FIG. 12 illustrates a schematic block diagram of a first transmitter module implemented as part of the second wireless automatic test equipment according to a first exemplary embodiment of the present invention. A transmitter module 1200 encodes, modulates, and/or upconverts the indication of operability 254 to provide the individual testing operation outcome 250 in accordance with the multiple access transmission scheme, as discussed above. The transmitter module 1200 represents an exemplary embodiment of the transmitter module 210.

The transmitter module 1200 includes an encoding module 1202, a modulating module 1208, and an upconverter module 1210. The encoding module 1202 encodes the testing operation command signal 1156 in accordance with the multiple access transmission scheme to provide an encoded indication of operability 1250. In an exemplary embodiment, the encoding module 1202 encodes the testing operation command signal 1156 in accordance with a code division multiple access (CDMA) scheme. In this exemplary embodiment, the encoding module 1202 includes a spreading code generator 1204 and a spreading module 1206. The spreading code generator 1204 provides a unique random, pseudo-random, and/or non-random sequence of data, referred to as a spreading code 1252, to the spreading module 1206. The spreading code 1252 represents to a sequence of bits that is unique to each of the transmitting antennas 1110.1 through 1110.*i*, herein the transmitting antennas 1110, or groups of the transmitting antennas 1110, to encode the indication of operability 254. The spreading module 1206 utilizes the spreading code 1252 to encode the testing operation command signal 1156 to provide spreaded initiate self-contained testing operations 1254.1 through 1254.*i*.

The modulating module 1208 modulates the spreaded initiate self-contained testing operations 1254.1 through 1254.*i* using any suitable analog or digital modulation techniques such as amplitude modulation (AM), frequency modulation (FM), phase modulation (PM), phase shift keying (PSK), frequency shift keying (FSK), amplitude shift keying (ASK), quadrature amplitude modulation (QAM) and/or any other suitable modulation technique that will be apparent to those skilled in the relevant art(s) to provide modulated initiate self-contained testing operations 1256.1 through 1256.*i*.

The upconverter module 1210 frequency translates or upconverts the modulated initiate self-contained testing operations 1256.1 through 1256.*i* to provide the initiate testing operation signals 1158.1 through 1158.*i*. More specifically, the upconverter module 1210 may upcovert the modulated initiate self-contained testing operations 1256.1 through 1256.*i* using a single carrier frequency and/or among multiple carriers to implement the multiple access transmission to provide the initiate testing operation signals 1158.1 through 1158.*i*. In an exemplary embodiment, the upconverter module 1210 is optional. In this exemplary embodiment, the modulating module 1208 directly provides the modulated initiate self-contained testing operations 1256.1 through 1256.*i* as the initiate testing operation signals 1158.1 through 1158.*i*.

Referring again to FIG. 11, the transmitting antennas 1110 provide the initiate testing operation signals 1158.1 through 1158.*i* as the initiate testing operation signals 850.1 through 850.*i* to the semiconductor components 106. In an exemplary embodiment, the transmitter module 1108 wirelessly sends the initiate testing operation signals 850.1 through 850.*i* to all of the semiconductor components 106 within the semiconductor wafer 102. However, this example is not limiting, those skilled in the relevant art(s) will recognize that initiate testing operation signals 850.1 through 850.*i* may be sent to a lesser number of the semiconductor components 106 within the semiconductor wafer 102 without departing from the spirit and scope of the present invention. The transmitting antennas 1110 may be positioned in the three dimensional space in a substantially similar manner as the receiving antennas 402. In another exemplary embodiment, the transmitting antennas 1110 include two transmitting antennas, namely a first transmitting antenna 1110.1 and a second transmitting antenna 1110.2. In this exemplary embodiment, the first transmitting antenna 1110.1 and the second transmitting antenna 1110.2 are placed at a distance of $d_1$ and $d_2$, correspondingly, from a center of the semiconductor wafer 102, the distance $d_1$ and the distance $d_2$ being similar to or dissimilar from each other. In this exemplary embodiment, the first transmitting antenna 1110.1 is separated from the second transmitting antenna 1110.2 by an angle $\theta$, such as ninety degrees to provide an example.

It should be noted that particular features, structures, or characteristics of the wireless automatic test equipment 400 and/or the wireless automatic test equipment 1100 are not limited to the embodiments of these wireless automatic test equipment as discussed above in FIG. 4 and FIG. 11. Rather, particular features, structures, or characteristics of the wireless automatic test equipment 400 may be combined with particular features, structures, or characteristics of the wireless automatic test equipment 1100 to provide additional exemplary embodiments of the wireless automatic test equipment. For example, another exemplary embodiment of the wireless automatic test equipment may include the receiving antennas 402 as discussed above in FIG. 4 and the transmitting antenna 1110 as discussed above in FIG. 11. Likewise, particular features, structures, or characteristics of the semiconductor component 200, and/or the semiconductor component 900 are not limited to the embodiments of these semiconductor components as discussed above in FIG. 2 and FIG. 9. Rather, particular features, structures, or characteristics of the semiconductor component 200 and/or the semiconductor component 900 may be combined with features, structures, or characteristics from one another to provide additional exemplary embodiments of the semiconductor component.

Methods to Verify the Semiconductor Components Operate as Expected and, Optionally, to Determine a Location of the Semiconductor Components Within the Semiconductor Wafer FIG. 13 is a flowchart 1300 of exemplary operational steps of a wireless automatic test equipment according to an exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 13.

At step 1302, one or more semiconductor components, such as one or more semiconductor components from among the semiconductor components 106 to provide an example, within a semiconductor wafer, such as the semiconductor wafer 102 to provide an example, are activated. The one or more semiconductor components may represent some or all of the semiconductor components that are formed onto the semiconductor wafer. The one or more semiconductor components may be activated by wirelessly receiving power from wireless automatic test equipment, such as the wireless automatic test equipment 104 or the wireless automatic test equipment 802 to provide some examples, as disclosed in U.S. patent application Ser. No. 12/877,955, filed on Sep. 8, 2010, which claims the benefit of U.S. Provisional Patent Application No. 61/298,751, filed on Jan. 27, 2010, each of which is incorporated by reference in its entirety. Alternatively, the one or more semiconductor components may receive power from a reduced semiconductor wafer testing probe. The reduced semiconductor wafer testing probe is less complicated than the conventional wafer testing probe, namely this reduced semiconductor wafer testing probe does not include a full complement of electronic testing probes to verify that the semiconductor components operate as expected. In an exemplary embodiment, this reduced semiconductor wafer testing probe only includes sufficient probes to provide the power to the one or more semiconductor components.

At step 1304, the wireless automatic test equipment provides a first initiate testing operation signal, such as the initiate testing operation signal 150 and/or a second initiate testing operation signal, such as the initiate testing operation signal 850 to the one or more semiconductor components from step 1302. The wireless automatic test equipment provides the first initiate testing operation signal using a transmitting antenna, such as a transmitting antenna 414 to provide an example, and/or the second initiate testing operation signal using multiple transmitting antennas, such as the transmitting antennas 1110 to provide an example, positioned in three dimensional space as described in FIG. 5A through FIG. 5C. The one or more semiconductor components from step 1302 may optionally determine one or more signal metrics of the second initiate testing operation signal from each of the multiple transmitting antennas. The one or more semiconductor components from step 1302 may generate a unique identification number, or tag, based upon the one or more signal metrics which may be used by the wireless automatic test equipment to determine a location of the one or more semiconductor components from step 1302 within the semiconductor wafer from step 1302. Alternatively, the one or more semiconductor components from step 1302 may include a random number generator to generate the unique identification number.

The first initiate testing operation signal and/or the second initiate testing operation signal may include a first set of parameters to be used by a first set of instructions that are stored within the one or more semiconductor components from step 1302 to perform a self-contained testing operation. Alternatively, the first initiate testing operation signal and/or the second initiate testing operation signal may include a second set of instructions and/or a second set of parameters to be used by the second set of instructions that are to be used by the one or more semiconductor components from step 1302 to perform a self-contained testing operation. In another alternate, the first initiate testing operation signal and/or the second initiate testing operation signal may include any combination of the first set of parameters, the second set of parameters, and/or the second set of instructions.

At step 1306, the one or more semiconductor components from step 1302 execute the self-contained testing operation. The self-contained testing operation may utilize the first set of parameters provided by the first initiate testing operation signal and/or the second initiate testing operation signal from step 1304 to perform the first set of instructions that are stored within the one or more semiconductor components from step 1302. Alternatively, the self-contained testing operation may execute the second set of instructions provided by the first initiate testing operation signal and/or the second initiate testing operation signal from step 1304 and/or the second set of parameters to be used by the second set of instructions that are provided by the by the first initiate testing operation signal and/or the second initiate testing operation signal from step 1304. In another alternate, the self-contained testing operation may include any combination of the first set of instructions, the second set of instructions, the first set of parameters and/or the second set of parameters.

At step 1308, the one or more semiconductor components from step 1302 communicate a testing operation outcome, such as the testing operation outcomes 152 and/or the testing operation outcome 852 to provide some examples, of the self-contained testing operation to the wireless automatic test equipment from step 1302. The one or more semiconductor components from step 1302 wirelessly transmit the testing operation outcomes to the wireless automatic test equipment from step 1302 over a common communication channel using the multiple access transmission scheme as described above. The testing operation outcome may include the unique identification number from step 1304 to allow the wireless automatic test equipment from step 1302 to determine the location of the semiconductor components from step 1302 within the semiconductor wafer from step 1302.

At step 1310, the wireless automatic test equipment from step 1302 observes the testing operation outcomes from step 1308 as they pass through the common communication channel. The wireless automatic test equipment from step 1302 may observe the testing operation outcomes from step 1308 using a receiving antenna, such as a receiving antenna 1102 to provide an example, or multiple receiving antennas, such as the receiving antennas 402 to provide an example, positioned in three dimensional space as described in FIG. 5A through FIG. 5C.

At step 1312, the wireless automatic test equipment from step 1302 may determine which of the one or more semiconductor components from step 1302 operate as expected and, optionally, their location within the semiconductor wafer from step 1302 based upon the testing operation outcomes observed from step 1310.

The wireless automatic test equipment from step 1302 may determine a first group of semiconductor components from among the one or more semiconductor components from step 1302 that operate as expected based upon the testing operation outcomes observed from step 1310. The wireless automatic test equipment from step 1302 evaluates the testing operation outcomes observed from step 1310 for each of the unique identification numbers from step 1304 to determine whether its corresponding the one or more semiconductor components from step 1302 is part of the first group of semiconductor components. Alternatively, the wireless automatic test equipment from step 1302 may determine a second group of semiconductor components from among the one or more semiconductor components from step 1302 that operate unexpectedly based upon the testing operation outcomes observed from step 1310. In another alternate, the wireless automatic test equipment from step 1302 may determine any combination of the first group of semiconductor components and the second group of semiconductor components. The wireless automatic test equipment from step 1302 may, optionally, determine one or more signal metrics of the testing operation outcomes observed from step 1310 to determine a location of the one or more semiconductor components from step 1302 within the semiconductor wafer from step 1302.

The wireless automatic test equipment from step 1302 may assign the one or more signal metrics to corresponding coordinates from among i sets of coordinates in the three dimensional space. The wireless automatic test equipment from step 1302 assigns the unique identification number from step 1304 to the i sets of coordinates. The wireless automatic test equipment from step 1302 maps the unique identification number from step 1304 to their corresponding semiconductor component 106 to determine the location of the one or more semiconductor components from step 1302 within the semiconductor wafer from step 1302. The wireless automatic test equipment from step 1302 may determine the location of the one or more semiconductor components from step 1302 by comparing the one or more signal metrics corresponding to each of the unique identification number from step 1304 to predetermined signal metrics for each of the one or more semiconductor components from step 1302. Alternatively, the wireless automatic test equipment from step 1302 may iteratively interpolate the location of the unique identification numbers from step 1304 to the semiconductor components from step 1302 within the semiconductor wafer from step 1302 based upon relationships between their corresponding one or more signal metrics.

Alternatively, the wireless automatic test equipment from step 1302 may assemble a map indicating the location of the semiconductor components from step 1302 within the semiconductor wafer from step 1302 by comparing the unique identification numbers to a predetermined mapping of the unique identification numbers to their respective locations within the semiconductor wafer from step 1302. Alternatively, the wireless automatic test equipment from step 1302 may iteratively interpolate the location of the semiconductor components from step 1302 within the semiconductor wafer from step 1302 based upon relationships between the unique identification numbers for each of the semiconductor components from step 1302.

Tagging of Functional Blocks of the Semiconductor Components

FIG. 14 illustrates a schematic block diagram of an integrated circuit under test implemented as part of the first and/or the second exemplary semiconductor components according to an exemplary embodiment of the present invention. An integrated circuit under test 1400 executes the self-contained testing operation 256 to determine whether it operates as expected. The integrated circuit under test 1400 includes one or more hardware modules, whereby some of these hardware modules may be divided into functional blocks B1 through B4. However, this example is for illustrative purposes only, it will be apparent to those skilled in the relevant art(s) that the integrated circuit under test 1400 may be divided differently into a lesser or a greater number of functional blocks without departing from the spirit and scope of the present invention.

The functional blocks B1 through B4 may encompass different hardware modules of the integrated circuit under test 1400 which may perform differing and/or similar functions. For example, a first functional block B1 may encompass a first transmitter that is configured to operate in accordance with an Institute of Electrical and Electronics Engineers (IEEE) communication standard, such as the IEEE 802.11 communications standard to provide an example. In this example, a second functional block B2 may encompass a second transmitter that is configured to operate in accordance with a Bluetooth communication standard. Additionally, some of the hardware modules of the integrated circuit under test 1400 may be assigned to more than one of the functional blocks B1 through B4. From the example above, the first transmitter and the second transmitter may share a common amplifier module. This common amplifier module may be assigned to the first functional block B1 and the second functional block B2 or assigned to a third functional block B3 that encompasses different hardware from the first functional block B1 and the second functional block B2.

Each of the functional blocks B1 through B4 may be assigned, or tagged, with a unique identifier. The unique identifier represents a sequence of bits that is unique to each of the functional blocks B1 through B4. In an exemplary embodiment, the unique identifier for each of the functional blocks B1 through B4 is stored in a memory device, such as any suitable non-volatile memory, any suitable volatile memory, or any combination of non-volatile and volatile memory that will be apparent to those skilled in the relevant art(s), that is implemented as part of a testing module, such as the testing module 206 or the testing module 906 to provide some examples. In another exemplary embodiment, the unique identifiers for the functional blocks B1 through B4 may be provided to the memory device by wireless automatic test equipment, such as the wireless automatic test equipment 400 or the wireless automatic test equipment 1100 to provide some examples. In this exemplary embodiment, the unique identifiers for the functional blocks B1 through B4 may be provided by the wireless automatic test equipment via an initiate testing operation signal, such as the initiate testing operation signal 150 or the initiate testing operation signals 850 to provide an example. Alternatively, the unique identifiers for the functional blocks B1 through B4 may be written into the memory device during manufacture of a semiconductor component that includes the integrated circuit under test 1400. In another alternate, each of the functional blocks B1 through B4 may include the memory device which stores the unique identifier for each of the functional blocks B1 through B4.

The functional blocks B1 through B4 may execute the self-contained testing operation 256, or a portion thereof, to determine whether they operate as expected. For example, the self-contained testing operation 256 may include one or more testing routines to be performed by the functional blocks B1 through B4. The one or more testing routines may include any combination of the first set of instructions, the second set of instructions, the first set of parameters and/or the second set of parameters as discussed above. In this example, the functional block B1 and the functional block B2 may execute a first testing routine and a second testing routine, respectively, thereof, to determine whether they operate as expected. Alternatively, the functional block B1 may execute the first testing routine and provide information resulting from the execution of the first testing routine to the functional block B2. The functional block B2 may use this information to execute the second testing routine to determine whether it operates as expected.

The functional blocks B1 through B4 provide the indication of operability 258 to the testing module, such as the testing module 206 or the testing module 906 to provide some examples, during and/or after execution of the self-contained testing operation 256. The indication of operability indicates whether the functional blocks B1 through B4 operate as expected or, alternatively, whether the functional blocks B1 through B4 operate unexpectedly and, optionally, the one or more of the functional blocks B1 through B4 that operates unexpectedly. Alternatively, the functional blocks B1 through B4 may provide their unique identifier as the indication of operability 258 to indicate that its corresponding functional block B1 through B4 operates as expected or, alternatively, operates unexpectedly.

The testing module, such as the testing module 206 or the testing module 906 to provide some examples, may analyze the indication of operability 258 to provide an indication of operability, such as the indication of operability 254 to provide an example. The testing module may provide the indication of operability that indicates that the functional blocks B1 through B4 operate as expected or, alternatively, or indicates that the functional blocks B1 through B4 operate unexpectedly and, optionally, the unique identifier corresponding to the functional blocks B1 through B4 that operates unexpectedly.

The tagging of the functional blocks of the semiconductor components in the manner as described above allows the wireless automatic test equipment, such as the wireless automatic test equipment 400 or the wireless automatic test equipment 1100 to provide some examples, to determine which functional blocks operate as expected. This allows manufacturers of the semiconductor components to distribute semiconductor components having lesser functionality even though these semiconductor components may be designed to perform greater functionality. For example, the integrated circuit under test 1400 may include a first transmitter that is configured to operate in accordance with the IEEE communication standard and a second transmitter that is configured to operate in accordance with the Bluetooth communication standard. In this example, the manufacturers of the integrated circuit under test 1400 may be able to distribute the semiconductor component having the integrated circuit under test 1400 as having the first transmitter even though the second transmitter does not operate as expected.

Optional Modules that may be Implemented as Part of the First or the Second Exemplary Wireless Automatic Test Equipment FIG. 15 illustrates a schematic block diagram of a thermal imaging module that may be implemented as part of the first or the second exemplary wireless automatic test equipment according to an exemplary embodiment of the present invention. A wireless testing environment 1500 includes a wireless testing equipment 1502 to allow for simultaneous testing of the semiconductor wafer 152 to verify that the semiconductor components 106 operate as expected. The wireless testing equipment 1502 has many features in common with the wireless testing equipment 104 and/or the wireless testing equipment 802 as discussed above; therefore, only differences between the wireless testing equipment 1502 and the wireless testing equipment 104 and/or the wireless testing equipment 802 are to be described in further detail.

The wireless testing equipment 1502 includes a performance measurement module 1504 to measure a performance of the semiconductor components 106. The performance measurement module 1504 observes semiconductor wafer infrared energy 1550 that is produced by the semiconductor wafer 152. More specifically, the semiconductor components 106 produce a corresponding one of semiconductor component infrared energies 1552.1 through 1552.n before, during, and/or after execution of the self-contained testing operation. For example, the semiconductor component 156.1 produces the semiconductor component infrared energy 1552.1 during execution of the self-contained testing operation.

The performance measurement module 1504 processes the semiconductor wafer infrared energy 1550 to provide a semiconductor wafer thermogram of the semiconductor wafer 152. The performance measurement module 1504 isolates a semiconductor component thermogram for the semiconductor components 106 from the semiconductor wafer thermogram. The performance measurement module 1504 compares the semiconductor component thermograms to one or more predetermined semiconductor component thermograms to measure the performance of the semiconductor components 106.

Second Exemplary Wireless Automatic Test Equipment

FIG. 16 illustrates a schematic block diagram of an optional performance measurement module implemented as part of the first or the second exemplary wireless automatic test equipment according to an exemplary embodiment of the present invention. A performance measurement module 1600 includes a thermal imaging module 1602 and a thermogram processor 1604 to measure a performance of the semiconductor components 106 based upon the semiconductor wafer infrared energy 1550. The performance measurement module 1600 may represent an exemplary embodiment of the performance measurement module 1504.

The thermal imaging module 1602 includes a thermal imaging device, such as a thermographic camera, a thermographic sensor, and/or any other suitable device that is capable of detecting infrared energy of the electromagnetic spectrum that is emitted, transmitted, and/or reflected by the semiconductor wafer 102. The thermal imaging module 1602 observes the semiconductor wafer infrared energy 1550 that is emitted, transmitted, and/or reflected by the semiconductor wafer 102. More specifically, the thermal imaging module 1602 observes the semiconductor component infrared energy 1552.1 through 1552.$n$ as the semiconductor wafer infrared energy 1550 before, during, and/or after execution of the self-contained testing operation. The thermal imaging module 1602 provides an observed thermal infrared energy 1650 to the thermogram processor 1604.

The thermogram processor 1604 processes the observed thermal infrared energy 1650 to provide a performance measure 1652 for the semiconductor components 106. The performance measure 1652 may be provided to an operator interface module, such as the operator interface module 410 to provide an example, for further processing for display on a graphical user interface. Alternatively, the performance measure 1652 may be provided to a testing processor, such as the testing processor 408 and/or the testing processor 1106 to provide some examples, to be included as part of the listing of testing results 460.

Exemplary Processing of Thermograms

FIG. 17A illustrates an operation of a thermogram processor used in the optional performance measurement module according to an exemplary embodiment of the present invention. The thermogram processor 1604 processes the observed thermal infrared energy 1650 to provide a semiconductor wafer thermogram 1700. The semiconductor wafer thermogram 1700 indicates the infrared energy emitted, transmitted, and/or reflected by the semiconductor wafer 102 as interpreted by one or more thermal processing algorithms. Those areas of the semiconductor wafer thermogram 1700 that are lightly shaded emit, transmit, and/or reflect more infrared energy than those areas of the semiconductor wafer thermogram 1700 that are heavily shaded. The semiconductor wafer thermogram 1700 as shown is for illustrative purposes only; those skilled in the relevant art(s) will recognize that other semiconductor wafer thermograms are possible without departing from the spirit and scope of the present invention.

The thermogram processor 1604 isolates a corresponding semiconductor component thermogram 1702.1 through 1702.$n$ for each of the semiconductor components 106 from the semiconductor wafer thermogram 1700. For example, the thermogram processor 1604 isolates the semiconductor component thermogram 1702.1 corresponding to the semiconductor component 106.1 from the semiconductor wafer thermogram 1700. Alternatively, the testing processor 408 may provide information relating to those semiconductor components 106 that operate as expected and their location within the semiconductor wafer 102. In this alternate, the thermogram processor 1604 isolates a corresponding semiconductor component thermogram 1702.1 through 1702.$n$ for those semiconductor components 106 that operate as expected from the semiconductor wafer thermogram 1700.

The thermogram processor 1604 compares the semiconductor component thermograms 1702.1 through 1702.$n$ to one or more predetermined semiconductor component thermograms to provide the performance measure 1152 for each of the semiconductor components 106, or, alternatively, for those semiconductor components 106 that operate as expected.

FIG. 17B illustrates predetermined semiconductor component thermograms according to an exemplary embodiment of the present invention. The thermogram processor 1604 compares the semiconductor component thermograms 1702.1 through 1702.$n$ to a predetermined semiconductor wafer thermogram 1704 to provide the performance measure 1152.

The predetermined semiconductor component thermogram 1704 includes predetermined semiconductor wafer thermograms 1706.1 through 1706.$n$. Each of the predetermined semiconductor wafer thermograms 1706.1 through 1706.$n$ are assigned to an indicia of performance 1708.1 through 1708.$n$. In an exemplary embodiment, the indicia of performance 1708.1 represents semiconductor components of the lowest quality and the indicia of performance 1708.$n$ represents semiconductor components of the highest quality. The semiconductor components of the lowest quality emit, transmit, and/or reflect more infrared energy when compared to the semiconductor components of the highest quality when performing the self-contained testing operation. As a result, the semiconductor components of the highest quality components are suitable to operate at higher operational speeds when compared to the semiconductor components of the lower quality.

The semiconductor components 106 that have a corresponding semiconductor component thermogram 1702.1 through 1702.$n$ that closely approximates one of the predetermined semiconductor wafer thermograms 1706.1 through 1706.$n$ are assigned to the corresponding indicia of performance 1708.1 through 1708.$n$. For example, the semiconductor components 106.1 and 106.$n$ exhibit the semiconductor component thermograms 1702.1 and 1702.$n$, correspondingly, that closely approximate the predetermined semiconductor wafer thermogram 1706.1; therefore, the semiconductor components 106.1 and 106.$n$ is assigned to the indicia of performance 1708.1. Similarly, the semiconductor component 106.2 exhibits the semiconductor component thermogram 1702.2 that closely approximates the predetermined semiconductor wafer thermogram 1706.2; therefore, the semiconductor components 106.2 is assigned to the indicia of performance 1708.2.

Methods to Measure a Performance of the Semiconductor Components Within the Semiconductor Wafer FIG. 18 is a flowchart 1800 of exemplary operational steps of the second wireless component testing environment according to an exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 18.

At step 1802, one or more semiconductor components, such as the semiconductor components 106 to provide an example, are formed onto a semiconductor wafer, such as the semiconductor wafer 102 to provide an example, execute a self-contained testing operation in a testing mode of operation. The self-contained testing operation represents instructions to be performed and/or one or more parameters to be used by the instructions that are used by the one or more semiconductor components to determine whether they operate as expected.

At step 1804, a wireless testing equipment, such as the wireless testing equipment 1100 to provide an example, observes infrared energy that is emitted, transmitted, and/or reflected by the semiconductor wafer before, during, and/or after execution of the self-contained testing operation. The wireless testing equipment may use a thermal imaging device, such as a thermographic camera, a thermographic sensor, and/or any other suitable device that is capable of detecting infrared energy of the electromagnetic spectrum that is emitted, transmitted, and/or reflected by the semiconductor wafer.

At step 1806, the wireless testing equipment processes the observed infrared energy to provide a semiconductor wafer thermogram of the semiconductor wafer 102. The semiconductor wafer thermogram indicates the infrared energy emitted, transmitted, and/or reflected by the semiconductor wafer as interpreted by one or more thermal processing algorithms.

At step 1808, the wireless testing equipment isolates a semiconductor component thermogram for each of the semiconductor components from the semiconductor wafer thermogram.

At step 1810, the wireless testing equipment compares the semiconductor component thermograms to one or more predetermined semiconductor component thermograms to measure the performance of the semiconductor components. Each of the predetermined semiconductor wafer thermograms are assigned to an indicia of performance. The semiconductor components that have a corresponding semiconductor component thermogram that closely approximates one of the predetermined semiconductor wafer thermograms are assigned to the corresponding indicia of performance.

Conclusion

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus, the present invention should not be limited by any of the above-described exemplary embodiments, but should be defined only in accordance with the following claims and their equivalents.

What is claimed is:

1. A wireless automatic test equipment for simultaneously testing a plurality of semiconductor components formed onto a semiconductor wafer, comprising:

a transmitter module configured to simultaneously send a plurality of initiate self-contained testing operation signals to the plurality of semiconductor components;

a receiver module configured to receive a plurality of testing operation outcomes from the plurality of semiconductor components over a common communication channel to provide a plurality of recovered testing outcomes, each of the plurality of recovered testing outcomes having a corresponding innate identification number from among a plurality of unique identification numbers that identifies one of the plurality of semiconductor components and indicating whether its respective semiconductor component operates as expected; and a testing processor configured to determine a first group of semiconductor components from among the plurality of semiconductor components that operate as expected based upon the plurality of recovered testing outcomes and corresponding first locations of the first grotto of semiconductor components within the semiconductor wafer based upon their corresponding unique identification numbers from among the identification numbers.

2. The wireless automatic test equipment of claim 1, further comprising:

a plurality of transmitting antennas, coupled to the transmitter module, configured to simultaneously send the plurality of initiate self-contained testing operation signals to the plurality of semiconductor components.

3. The wireless automatic test equipment of claim 2, wherein the plurality of transmitting antennas are positioned along a radius of a spherical shell in a three dimensional space.

4. The wireless automatic test equipment of claim 2, wherein the plurality of transmitting antennas are positioned along a corresponding radius from among a. plurality of radii of a corresponding spherical shell from among a plurality of spherical shells in a three dimensional space.

5. The wireless automatic test equipment of claim 1, wherein the receiver module is further configured to simultaneously receive the plurality of testing operation outcomes over the common communication channel.

6. The wireless automatic test equipment of claim 1, wherein the receiver module is further configured to decode the plurality of testing operation outcomes in accordance with a multiple access transmission scheme to provide the plurality of recovered testing outcomes.

7. The wireless automatic test equipment of claim 6, wherein the multiple access transmission scheme is a code division multiple access (CDMA) scheme.

8. The wireless automatic test equipment of claim 1, wherein the testing processor is further configured to determine a second group of semiconductor components from among the plurality of semiconductor components that operate unexpectedly based upon the plurality of recovered testing outcomes.

9. The wireless automatic test equipment of claim 1, wherein the testing processor is further configured to compare the plurality of unique identification numbers to a predetermined mapping of the plurality of unique identification numbers to their corresponding locations within the semiconductor wafer to assemble a map indicating the corresponding first locations of the first group of semiconductor components.

10. The wireless automatic test equipment of claim 1, wherein the testing processor is further configured to iteratively map the plurality of unique identification numbers to their corresponding semiconductor components based upon relationships between the plurality of unique identification numbers.

11. A semiconductor component formed on a semiconductor water, comprising:

a transceiver module configured to receive a plurality of initiate testing operation signals and to provide a plurality of initiate test control signals;

a metric measurement module configured to determine a plurality of signal metrics for the plurality of initiate test control signals;

a testing module configured to generate a unique identification number for the semiconductor component based upon the plurality of signal metrics and to provide a self-contained testing operation in response to the plurality of initiate test control signals; and an integrated circuit under test configured to provide an indication of operability in response to executing the self-contained testing operation, the indication of operability indicating whether the integrated circuit under test operates as expected, wherein the testing module is further configured to append the unique identification number to the indication of operability.

12. The semiconductor component of claim 11, wherein the transceiver module is configured to encode the indication of operability in accordance with a multiple access transmission scheme.

13. The semiconductor component of claim 11, wherein the multiple access transmission scheme is a code division multiple access (CDMA) scheme.

14. The semiconductor component of claim 11, wherein the testing module is further configured to enter into a testing mode of operation in response to the plurality of initiate testing operation signals.

15. The semiconductor component of claim 11, wherein the transceiver module comprises:
   a downconverter module configured to downconvert the plurality of initiate test control signals to provide a plurality of downconverted testing operation outcomes;
   a demodulating module configured to demodulate the plurality of doyvnconverted testing operation outcomes in accordance with a digital modulation technique to provide a plurality of demodulated testing operation outcomes; and
   a decoding module configured to decode the plurality of demodulated testing operation outcomes in accordance with a multiple access transmission scheme to provide the plurality of initiate test control signals.

16. A semiconductor component formed on a semiconductor wafer, comprising:
   a transceiver module configured to receive a plurality of initiate testing operation signals to provide a plurality of initiate test control signals;
   a testing module configured to generate a unique identification number for the semiconductor component and to provide a self-contained testing operation in response to the plurality of initiate test control signals; and
   an integrated circuit under test configured to provide an indication of operability in response to executing the sells-contained testing operation, the indication of operability indicating whether the integrated circuit under test operates as expected, wherein the testing module is further configured to append the unique identification number to the indication of operability.

17. The semiconductor component of claim 16, wherein the transceiver module is configured to encode the indication of operability in accordance with a multiple access transmission scheme.

18. The semiconductor component of claim 16, wherein the multiple access transmission scheme is a code division multiple access (CDMA) scheme.

19. The semiconductor component of claim 16, wherein the testing module enters into a testing mode of operation in response to the plurality of testing operation signals.

20. The semiconductor component of claim 16, wherein the transceiver module comprises:
   dowuconverter module configured to downconvert the plurality of initiate test control signals to provide a plurality of downconverted testing operation outcomes;
   a demodulating module configured to demodulate the plurality of downconverted testing operation outcomes in accordance with a digital modulation technique to provide a plurality of demodulated testing operation outcomes; and
   a decoding module configured to decode the plurality of demodulated testing operation outcomes in accordance with a multiple access transmission scheme to provide the plurality of initiate test control signals.

21. The semiconductor component of claim. 16, wherein the testing module comprises:
   a random number generator configured to generate the unique identification number.

22. The wireless automatic test equipment of claim 8, wherein the testing processor is further configured to determine corresponding second locations of the second group of semiconductor components within the semiconductor wafer based upon their corresponding unique identification numbers from among the plurality of unique identification numbers.

* * * * *

UNITED STATES PATENT AND TRADEMARK OFFICE
CERTIFICATE OF CORRECTION

PATENT NO. : 8,866,502 B2  
APPLICATION NO. : 13/029653  
DATED : October 21, 2014  
INVENTOR(S) : Behzad et al.

Page 1 of 1

It is certified that error appears in the above-identified patent and that said Letters Patent is hereby corrected as shown below:

In the Claims

In column 31, line 60, replace "innate" with --unique--.
In column 32, line 2, replace "grotto" with --group--.
In column 32, line 5, replace "the identification numbers" with --the plurality of identification numbers--.
In column 32, line 18, replace "a. plurality" with --a plurality--.
In column 33, line 11, replace "claim 11" with --claim 12--.
In column 33, line 24, replace "doyvconverted" with --downcoverted--.
In column 34, line 1, replace "sells-contained" with --self-contained--.
In column 34, line 11, replace "claim 16" with --claim 17--.
In column 34, line 19, replace "dowuconverter" with --a downcoverter--.

Signed and Sealed this  
Tenth Day of February, 2015

Michelle K. Lee  
*Deputy Director of the United States Patent and Trademark Office*